United States Patent
Yamaguchi et al.

(10) Patent No.: US 7,928,470 B2
(45) Date of Patent: Apr. 19, 2011

(54) SEMICONDUCTOR DEVICE HAVING SUPER JUNCTION MOS TRANSISTOR AND METHOD FOR MANUFACTURING THE SAME

(75) Inventors: Hitoshi Yamaguchi, Nisshin (JP); Jun Sakakibara, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/598,646

(22) Filed: Nov. 14, 2006

(65) Prior Publication Data

US 2007/0120201 A1    May 31, 2007

(30) Foreign Application Priority Data

Nov. 25, 2005    (JP) ................. 2005-340940

(51) Int. Cl.
*H01L 29/66*    (2006.01)
(52) U.S. Cl. ........ 257/135; 257/263; 257/328; 257/329; 257/E27.022; 257/E27.096; 257/E29.257
(58) Field of Classification Search .................. 257/256, 257/267, 287, 329
See application file for complete search history.

(56) References Cited

U.S. PATENT DOCUMENTS

| | | | | |
|---|---|---|---|---|
| 4,811,065 A * | 3/1989 | Cogan | ............................ | 257/328 |
| 4,952,992 A * | 8/1990 | Blanchard | ..................... | 257/342 |
| 5,216,275 A * | 6/1993 | Chen | .............................. | 257/493 |
| 5,915,179 A * | 6/1999 | Etou et al. | ..................... | 438/268 |
| 6,724,039 B1 * | 4/2004 | Blanchard | ..................... | 257/328 |
| 7,005,704 B2 * | 2/2006 | Hayashi et al. | ............... | 257/342 |
| 7,078,782 B2 * | 7/2006 | Shirai et al. | ................... | 257/473 |
| 2001/0032998 A1 * | 10/2001 | Iwamoto et al. | .............. | 257/330 |
| 2003/0006473 A1 * | 1/2003 | Rodov et al. | .................. | 257/493 |
| 2003/0020134 A1 * | 1/2003 | Werner et al. | ................. | 257/471 |
| 2003/0235942 A1 * | 12/2003 | Nakamura et al. | ............ | 438/138 |
| 2004/0099905 A1 * | 5/2004 | Baliga | ........................... | 257/328 |
| 2005/0242411 A1 * | 11/2005 | Tso | ................................ | 257/480 |

FOREIGN PATENT DOCUMENTS

JP    A-2002-076370    3/2002

* cited by examiner

*Primary Examiner* — Lynne A Gurley
*Assistant Examiner* — Jesse Y Miyoshi
(74) *Attorney, Agent, or Firm* — Posz Law Group, PLC

(57) ABSTRACT

A semiconductor device having a super junction MOS transistor includes: a semiconductor substrate; a first semiconductor layer on the substrate; a second semiconductor layer on the first semiconductor layer; a channel forming region on a first surface portion of the second semiconductor layer; a source region on a first surface portion of the channel forming region; a source contact region on a second surface portion of the channel forming region; a gate electrode on a third surface portion of the channel forming region; a source electrode on the source region and the source contact region; a drain electrode on a backside of the substrate; and an anode electrode on a second surface portion of the second semiconductor layer. The anode electrode provides a Schottky barrier diode.

17 Claims, 19 Drawing Sheets

SEMICONDUCTOR DEVICE HAVING SUPER JUNCTION MOS TRANSISTOR AND METHOD FOR MANUFACTURING THE SAME

CROSS REFERENCE TO RELATED APPLICATION

This application is based on Japanese Patent Application No. 2005-340940 filed on Nov. 25, 2005, the disclosure of which is incorporated herein by reference.

FIELD OF THE INVENTION

The present invention relates to a semiconductor device having a super junction MOS transistor and a method for manufacturing the same.

BACKGROUND OF THE INVENTION

As an inverter device for operating an alternating current motor with high efficiency, a circuit having a switching element (IGBT element, etc.) and a reflux diode (FWD) set to be parallel is used in an equivalent circuit of one phase amount of an inverter shown in FIG. 26 (e.g., U.S. Pat. No. 5,915,179). More particularly, in FIG. 26, switching elements Q1, Q2 are connected in series between an electric power source and the ground, and reflux diodes (Df1, Df2) externally attached are respectively connected to the respective switching elements (Q1, Q2) in parallel. A load electric current is flowed by turning-on one switching element Q1 (see FIG. 27). When the switching element Q1 is turned off from this state, a free wheel electric current is flowed through the reflux diode Df2 (see FIG. 27). Further, when the switching element Q1 is turned on from this state, a recovery electric current of the reflux diode Df2 is flowed.

A device of low loss is required in the switching elements Q1, Q2 and the reflux diodes Df1, Df2 to reduce loss of the inverter circuit.

IGBT has been used as the switching elements Q1, Q2 at middle and high withstand voltages of 100 volts or more. However, the development of super junction type MOS is advanced from this requirement of low loss formation.

On the other hand, reductions in loss of the reflux electric current shown in FIG. 27 and the recovery electric current are required as the reflux diodes Df1, Df2. PN junction of silicon (Si) is used at the middle and high withstand voltages of 100 volts or more. However, a Schottky barrier diode (SBD) is ideal to reduce a forward voltage and reduce recovery (reduce carrier accumulation), and high withstand voltage formation is expected.

U.S. Pat. No. 5,915,179 proposes a structure in which power MOS and the Schottky barrier diode (SBD) are adjacently integrated on one chip and are electrically connected in parallel.

Further, JP-A-2002-76370 proposes a structure in which the Schottky barrier diode (SBD) is formed in a super junction substrate and is formed by silicon (Si) so as to withstand high voltage.

In U.S. Pat. No. 5,915,179, when the Schottky barrier diode is formed in an N⁻ layer of silicon (Si), it is impossible to realize that the reduction of the forward voltage and the high withstand voltage formation are reconciled. Therefore, a problem exists in that no integration with a high withstand voltage power MOS transistor can be performed. Further, no Schottky barrier diode can be integrated without increasing an area of the power MOS transistor.

Further, in JP-A-2002-76370, the MOS transistor and this Schottky barrier diode (SBD) are separate parts as a free wheel diode when an inverter system is formed. Therefore, it is large-sized and there is a difficulty in mounting.

SUMMARY OF THE INVENTION

In view of the above-described problem, it is an object of the present disclosure to provide a semiconductor device having a super junction MOS transistor. It is another object of the present disclosure to provide a method for manufacturing a semiconductor device having a super junction MOS transistor.

According to a first aspect of the present disclosure, a semiconductor device having a super junction MOS transistor includes: a semiconductor substrate having a first conductive type and a high impurity concentration; a first semiconductor layer disposed on the substrate, wherein the first semiconductor layer includes a plurality of first impurity diffusion regions having the first conductive type and a plurality of second impurity diffusion regions having a second conductive type, which are alternately arranged so that the first semiconductor layer provides a drift region; a second semiconductor layer having the first conductive type disposed on the first semiconductor layer, wherein the second semiconductor layer has a low impurity concentration, which is lower than that of the semiconductor substrate; a channel forming region having the second conductive type disposed on a first surface portion of the second semiconductor layer; a source region having the first conductive type disposed on a first surface portion of the channel forming region; a source contact region having the second conductive type disposed on a second surface portion of the channel forming region; a gate electrode disposed on a third surface portion of the channel forming region through a gate insulation film, the third surface portion which is exposed from the source region and the source contact region; a source electrode disposed on the source region and the source contact region; a drain electrode disposed on a backside of the substrate, which is opposite to the first semiconductor layer; and an anode electrode disposed on a second surface portion of the second semiconductor layer, the second surface portion which is exposed from the channel forming region. The anode electrode provides a Schottky barrier diode so that the super junction MOS transistor and the Schottky barrier diode are integrated in the semiconductor device.

In the above device, the super junction MOS transistor and the Schottky barrier diode having the super junction construction are integrated, so that the diode has high withstand voltage and low loss. Further, the MOS transistor has high withstand voltage and low loss.

According to a second aspect of the present disclosure, a semiconductor device having a super junction MOS transistor includes: a semiconductor substrate having a first conductive type and a high impurity concentration; a first semiconductor layer disposed on the substrate, wherein the first semiconductor layer includes a plurality of first impurity diffusion regions having the first conductive type and a plurality of second impurity diffusion regions having a second conductive type, which are alternately arranged so that the first semiconductor layer provides a drift region; a second semiconductor layer having the first conductive type disposed on the first semiconductor layer, wherein the second semiconductor layer has a low impurity concentration, which is lower than that of the semiconductor substrate; a channel forming region having the second conductive type disposed on a first surface portion of the second semiconductor layer; a source region having the first conductive type disposed on a first surface portion of the channel forming region; a source contact region having the second conductive type disposed on a second surface portion of the channel forming region; an anode electrode disposed on a second surface portion of the second semiconductor layer, the second surface portion which is exposed from the channel forming region; a trench disposed on a third surface portion of the second semiconductor layer to penetrate the source region and the channel forming region; a gate electrode disposed on an inner wall of the trench through a gate insulation film; a source electrode disposed on the source region and the source contact region; and a drain electrode disposed on a backside of the substrate, which is opposite to the first semiconductor layer. The anode electrode provides a Schottky barrier diode so that the super junction MOS transistor and the Schottky barrier diode are integrated in the semiconductor device.

In the above device, the super junction MOS transistor and the Schottky barrier diode having the super junction construction are integrated, so that the diode has high withstand voltage and low loss. Further, the MOS transistor has high withstand voltage and low loss.

According to a third aspect of the present disclosure, a semiconductor device having a super junction MOS transistor includes: a semiconductor substrate having a first conductive type and a high impurity concentration; a first semiconductor layer disposed on the substrate, wherein the first semiconductor layer includes a plurality of first impurity diffusion regions having the first conductive type and a plurality of second impurity diffusion regions having a second conductive type, which are alternately arranged so that the first semiconductor layer provides a drift region; a low concentration channel forming region having the second conductive type disposed on the first semiconductor layer; a well region having the first conductive type disposed on a first surface portion of the low concentration channel forming region, wherein the well region reaches the first semiconductor layer; a high concentration channel forming region having the second conductive type disposed on a second surface portion of the low concentration channel forming region, wherein the high concentration channel forming region has a high impurity concentration, which is higher than that of the low concentration channel forming region; a source region having the first conductive type disposed on a first surface portion of the high concentration channel forming region; a source contact region having the second conductive type disposed on a second surface portion of the high concentration channel forming region; a gate electrode disposed on a third surface portion of the low concentration channel forming region and a third surface portion of the high concentration channel forming region through a gate insulation film, each third surface portion which is exposed from the source region and the source contact region; a source electrode disposed on the source region and the source contact region; a drain electrode disposed on a backside of the substrate, which is opposite to the first semiconductor layer; and an anode electrode disposed on the well region, which is exposed from the low concentration channel forming region. The anode electrode provides a Schottky barrier diode so that the super junction MOS transistor and the Schottky barrier diode are integrated in the semiconductor device.

In the above device, the super junction MOS transistor and the Schottky barrier diode having the super junction construction are integrated, so that the diode has high withstand voltage and low loss. Further, the MOS transistor has high withstand voltage and low loss.

According to a fourth aspect of the present disclosure, a semiconductor device having a super junction MOS transistor includes: a semiconductor substrate having a first conductive type and a high impurity concentration; a first semiconductor layer disposed on the substrate, wherein the first semiconductor layer includes a plurality of first impurity diffusion regions having the first conductive type and a plurality of second impurity diffusion regions having a second conductive type, which are alternately arranged so that the first semiconductor layer provides a drift region; a channel forming region having a second conductive type disposed on a first surface portion of the first semiconductor layer; a source region having the first conductive type disposed on a first surface portion of the channel forming region; a source contact region having the second conductive type disposed on a second surface portion of the channel forming region; a gate electrode disposed on a third surface portion of the channel forming region through a gate insulation film, the third surface portion which is exposed from the source region and the source contact region; a source electrode disposed on the source region and the source contact region; a drain electrode disposed on a backside of the substrate, which is opposite to the first semiconductor layer; and an anode electrode disposed on a second surface portion of the first semiconductor layer, the second surface portion which is exposed from the channel forming region. The anode electrode provides a Schottky barrier diode so that the super junction MOS transistor and the Schottky barrier diode are integrated in the semiconductor device.

In the above device, the super junction MOS transistor and the Schottky barrier diode having the super junction construction are integrated, so that the diode has high withstand voltage and low loss. Further, the MOS transistor has high withstand voltage and low loss.

According to a fifth aspect of the present disclosure, a method for manufacturing a semiconductor device includes: forming a first semiconductor layer on a semiconductor substrate, wherein the semiconductor substrate has a first conductive type and a high impurity concentration, and wherein the first semiconductor layer includes a plurality of first impurity diffusion regions having the first conductive type and a plurality of second impurity diffusion regions having a second conductive type, which are alternately arranged so that the first semiconductor layer provides a drift region; forming a second semiconductor layer having the first conductive type on the first semiconductor layer by using an epitaxial growth method; forming a planar gate electrode on the second semiconductor layer through a gate insulation film; forming a channel forming region having the second conductive type on a first surface portion of the second semiconductor layer by using the planar gate electrode as a self-alignment member; forming a source region having the first conductive type disposed on a first surface portion of the channel forming region; forming a source contact region having the second conductive type disposed on a second surface portion of the channel forming region; forming an opening on the planar gate electrode by using a photo lithography etching method, wherein the opening corresponds to an anode electrode, which provides a Schottky barrier diode; forming an insulation film on whole area of the second semiconductor layer; removing a part of the insulation film, which corresponds to a source electrode and the anode electrode by using a photo lithography etching method; forming the source electrode on the source region and the source contact region; forming the anode electrode on a second surface portion of the second semiconductor layer, the second surface portion which is exposed from the channel forming region through the opening of the planar gate electrode; and forming a drain electrode on a backside of the substrate, which is opposite to the first semiconductor layer. The second semiconductor layer has a low impurity concentration, which is lower than that of the semiconductor substrate, and the gate electrode is disposed on a third surface portion of the channel forming region through the gate insulation film, the third surface portion which is exposed from the source region and the source contact region.

The above method provides the device, in which the super junction MOS transistor and the Schottky barrier diode having the super junction construction are integrated, so that the diode has high withstand voltage and low loss. Further, in the device, the MOS transistor has high withstand voltage and low loss.

According to a sixth aspect of the present disclosure, a method for manufacturing a semiconductor device includes: forming a first semiconductor layer on a semiconductor substrate, wherein the semiconductor substrate has a first conductive type and a high impurity concentration, and wherein the first semiconductor layer includes a plurality of first impurity diffusion regions having the first conductive type and a plurality of second impurity diffusion regions having a second conductive type, which are alternately arranged so that the first semiconductor layer provides a drift region; forming a second semiconductor layer having the first conductive type on the first semiconductor layer by using an epitaxial growth method; forming a trench on a third surface portion of the second semiconductor layer; embedding a gate electrode on an inner wall of the trench through a gate insulation film; forming a channel forming region having the second conductive type on a first surface portion of the second semiconductor layer by using the gate electrode as a self-alignment member; forming a source region having the first conductive type on a first surface portion of the channel forming region; forming a source contact region having the second conductive type on a second surface portion of the channel forming region; forming an insulation film on whole area of the second semiconductor layer; removing a part of the insulation film, which corresponds to a source electrode and an anode electrode by using a photo lithography etching method, wherein the anode electrode provides a Schottky barrier diode; forming the source electrode on the source region and the source contact region; forming the anode electrode on a second surface portion of the second semiconductor layer, the second surface portion which is exposed from the channel forming region; and forming a drain electrode on a backside of the substrate, which is opposite to the first semiconductor layer. The second semiconductor layer has a low impurity concentration, which is lower than that of the semiconductor substrate, and the trench penetrates the source region and the channel forming region.

The above method provides the device, in which the super junction MOS transistor and the Schottky barrier diode having the super junction construction are integrated, so that the diode has high withstand voltage and low loss. Further, in the device, the MOS transistor has high withstand voltage and low loss.

According to a seventh aspect of the present disclosure, a method for manufacturing a semiconductor device includes: forming a first semiconductor layer on a semiconductor substrate, wherein the semiconductor substrate has a first conductive type and a high impurity concentration, and wherein the first semiconductor layer includes a plurality of first impurity diffusion regions having the first conductive type and a plurality of second impurity diffusion regions having a second conductive type, which are alternately arranged so that the first semiconductor layer provides a drift region; forming a low concentration channel forming region having the second conductive type on the first semiconductor layer by using an epitaxial growth method; forming a well region having the first conductive type on a first surface portion of the low concentration channel forming region, wherein the well region reaches the first impurity diffusion regions; forming a planar gate electrode on the low concentration channel forming region through a gate insulation film; forming a high concentration channel forming region having the second conductive type on a second surface portion of the low concentration channel forming region by using the planar gate electrode as a self-alignment member, wherein the high concentration channel forming region has a high impurity concentration, which is higher than that of the low concentration channel forming region; forming a source region having the first conductive type on a first surface portion of the high concentration channel forming region; forming a source contact region having the second conductive type on a second surface portion of the high concentration channel forming region; forming an opening on the planar gate electrode by using a photo lithography etching method, wherein the opening corresponds to an anode electrode, which provides a Schottky barrier diode; forming an insulation film on whole area of the low concentration channel forming region; removing a part of the insulation film, which corresponds to a source electrode and the anode electrode by using a photo lithography etching method; forming the source electrode on the source region and the source contact region; forming the anode electrode on the well region, which is exposed from the low concentration channel forming region; and forming a drain electrode on a backside of the substrate, which is opposite to the first semiconductor layer. The planar gate electrode having the opening is disposed on a third surface portion of the low concentration channel forming region and a third surface portion of the high concentration channel forming region through the gate insulation film, each third surface portion which is exposed from the source region and the source contact region.

The above method provides the device, in which the super junction MOS transistor and the Schottky barrier diode having the super junction construction are integrated, so that the diode has high withstand voltage and low loss. Further, in the device, the MOS transistor has high withstand voltage and low loss.

According to an eighth aspect of the present disclosure, a method for manufacturing a semiconductor device includes: forming a first semiconductor layer on a semiconductor substrate, wherein the semiconductor substrate has a first conductive type and a high impurity concentration, and wherein the first semiconductor layer includes a plurality of first impurity diffusion regions having the first conductive type and a plurality of second impurity diffusion regions having a second conductive type, which are alternately arranged so that the first semiconductor layer provides a drift region; forming a planar gate electrode on the first semiconductor layer through a gate insulation film; forming a channel forming region having the second conductive type on a first surface portion of the first semiconductor layer by using the planar gate electrode as a self-alignment member; forming a source region having the first conductive type disposed on a first surface portion of the channel forming region; forming a source contact region having the second conductive type disposed on a second surface portion of the channel forming region; forming an opening on the planar gate electrode by using a photo lithography etching method, wherein the opening corresponds to an anode electrode, which provides a Schottky barrier diode; forming an insulation film on whole area of the first semiconductor layer; removing a part of the insulation film, which corresponds to a source electrode and the anode electrode by using a photo lithography etching method; forming the source electrode on the source region and the source contact region; forming the anode electrode on a second surface portion of the first semiconductor layer, the second surface portion which is exposed from the channel forming region through the opening of the planar gate electrode; and forming a drain electrode on a backside of the substrate, which is opposite to the first semiconductor layer. The gate electrode is disposed on a third surface portion of the channel forming region through the gate insulation film, the third surface portion which is exposed from the source region and the source contact region.

The above method provides the device, in which the super junction MOS transistor and the Schottky barrier diode having the super junction construction are integrated, so that the diode has high withstand voltage and low loss. Further, in the device, the MOS transistor has high withstand voltage and low loss.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
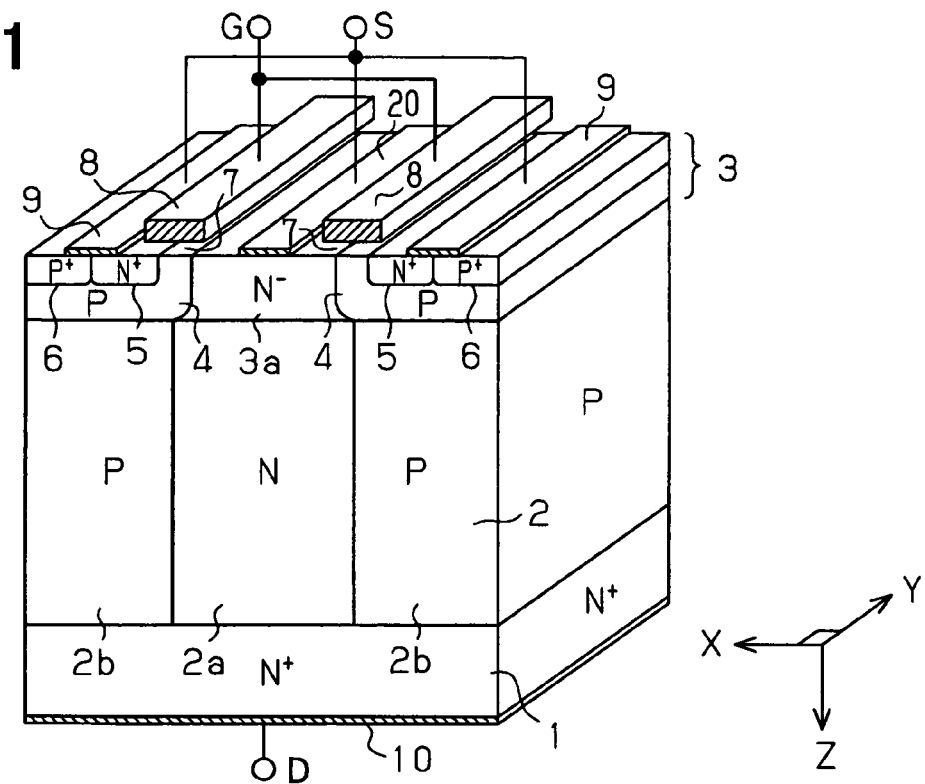
FIG. 1 is a schematic perspective view showing a semiconductor device.
Figure 2:
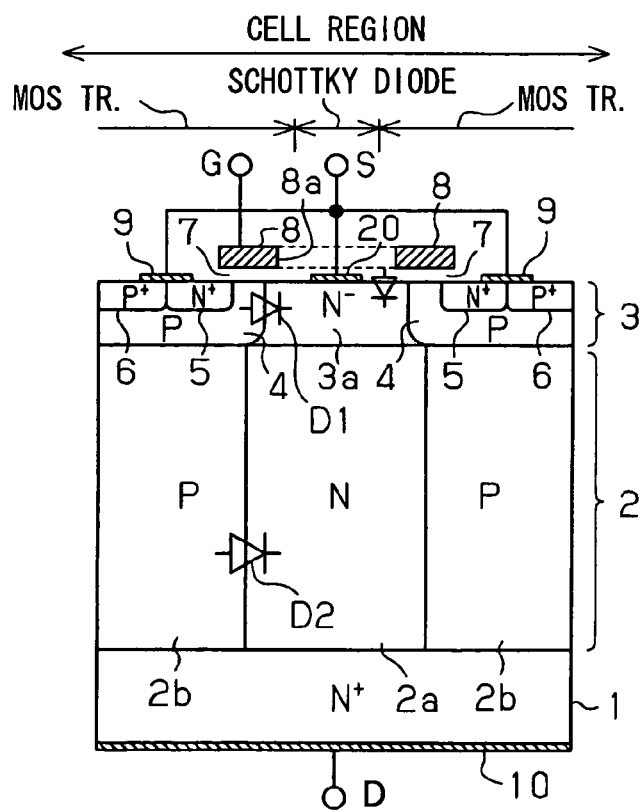
FIG. 2 is a cross sectional view showing the device in FIG. 1.
Figure 3:
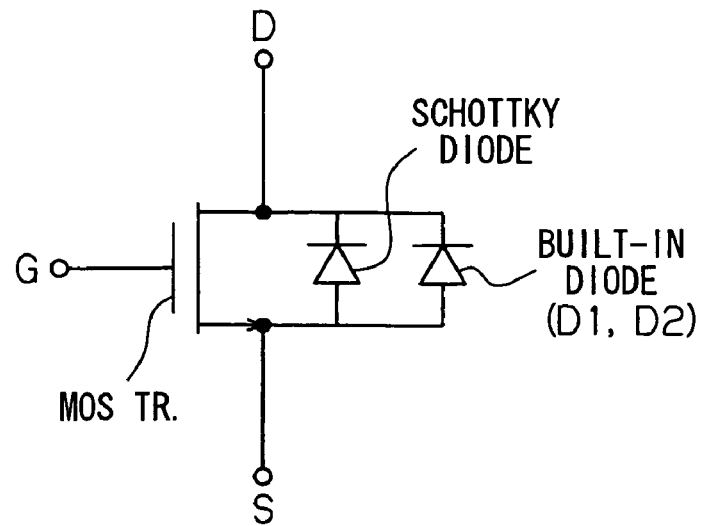
FIG. 3 is a circuit diagram showing an equivalent circuit of the device in FIG. 1.

FIG. 1 shows a perspective view of a semiconductor device in this embodiment mode. FIG. 2 shows a longitudinal sectional view of the semiconductor device in this embodiment mode. FIG. 3 shows an equivalent circuit.

This semiconductor device is a semiconductor device having a super junction MOS structure, and a super junction MOS transistor and a Schottky barrier diode are integrated. The MOS transistor is an N channel transistor.

A silicon layer 2 as a semiconductor layer is laminated on an $N^+$ silicon substrate 1 as a high concentration semiconductor substrate of a first electric conductivity type. An impurity diffusive area 2a of an N type (first electric conductivity type) and an impurity diffusive area 2b of a P type (second electric conductivity type) as a drift area are adjacently alternately arranged in the silicon layer 2. Thus, the super junction structure is constructed by adjacently alternately arranging the N type impurity diffusive area 2a and the P type impurity diffusive area 2b.

An $N^-$ silicon layer 3 as a low concentration semiconductor layer of the first electric conductivity type is laminated on the silicon layer 2. A channel forming area (P well layer) 4 of the P type (second electric conductivity type) is formed in a surface layer portion of the $N^-$ silicon layer 3. A lower end of the channel forming area (P well layer) 4 reaches the impurity diffusive area 2b of the P type. Further, an $N^+$ source area 5 is formed in the surface layer portion of the $N^-$ silicon layer 3 within the channel forming area 4. Further, a $P^+$ source contact area 6 is formed in the surface layer portion of the $N^-$ silicon layer 3 within the channel forming area 4 so as to be adjacent to the $N^+$ source area 5.

A gate electrode 8 is arranged on a part exposing the channel forming area 4 on an upper face of the $N^-$ silicon layer 3 through a gate oxide film 7 as a gate insulating film. A source electrode 9 is arranged in a part exposing the source area 5 and the source contact area 6 on the upper face of the $N^-$ silicon layer 3. The source electrode 9 is electrically connected to the $N^+$ source area 5 and the $P^+$ area 6 for a contact. A drain electrode 10 is arranged on a rear face of the $N^+$ silicon substrate 1, and is electrically connected to the $N^+$ silicon substrate 1. The super junction MOS transistor is constructed by such a structure.

Further, an anode electrode 20 constituting the Schottky barrier diode is arranged in a part exposing a low concentration area 3a of the N type on the upper face of the $N^-$ silicon layer 3. Thus, the super junction MOS (SJ-MOS) transistor and the Schottky barrier diode (SBD) are integrated.

At this time, the super junction structure is commonly used in the MOS transistor and the Schottky barrier diode in withstand voltage support.

In particular, the anode electrode 20 is arranged in the part exposing the low concentration area 3a of the N type between the adjacent channel forming areas 4 on the upper face of the $N^-$ silicon layer 3 within a transistor cell forming area. Namely, similar to the channel forming area 4 constituting the MOS transistor, SBD is constructed by forming the anode electrode 20 on the surface of the $N^-$ silicon layer 3 sandwiched by the channel forming area 4 constituting an adjacent separate MOS transistor. More particularly, an opening portion 8a is formed in the common gate electrode 8 within each cell within the transistor cell forming area. The anode electrode 20 is formed in the opening portion 8a. Further, the anode electrode 20 and the source electrode 9 are short-circuited within a chip.

As shown in FIG. 2, a first built-in diode D1 is formed by PN junction of the channel forming area (P well layer) 4 and the $N^-$ area 3a. A second built-in diode D2 is also formed by PN junction of the N type impurity diffusive area 2a and the P type impurity diffusive area 2b. In an equivalent circuit shown in FIG. 3, the Schottky barrier diode is connected to the MOS transistor in parallel, and the built-in diodes (D1, D2) are connected to the MOS transistor in parallel.

The operation of the semiconductor device of this embodiment mode will next be explained by using FIGS. 4, 5 and 6.

Figure 4:
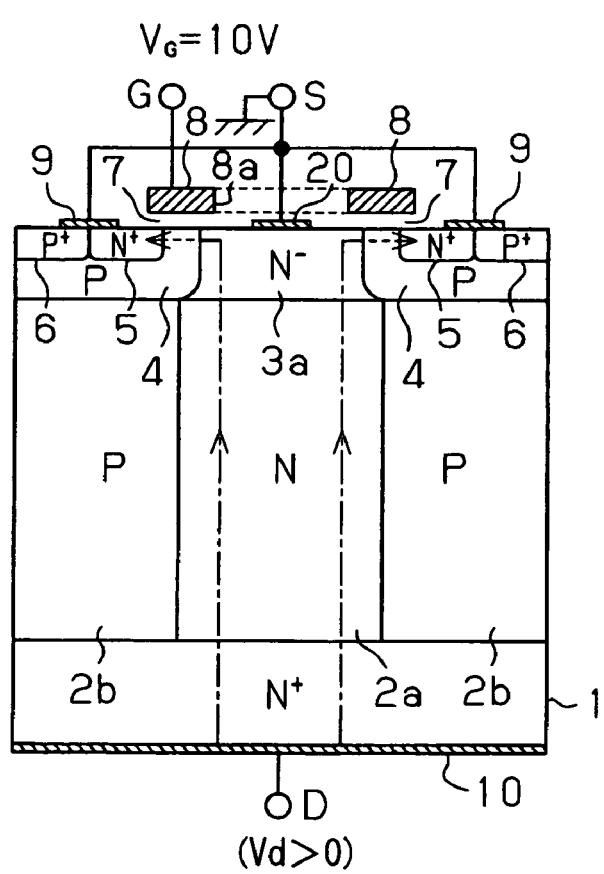
FIGS. 4 to 6 are cross sectional views explaining an operation of the device in FIG. 1.

As shown in FIG. 4, a source terminal (source electrode 9) is connected to the ground, and a positive voltage is applied to a drain terminal (drain electrode 10). Namely, a positive bias voltage is applied as a voltage Vds between the drain and the source. Further, 10 volts are applied to a gate terminal (gate electrode 8). Namely, 10 volts are applied as a voltage Vgs between the gate and the source.

In this case, only the super junction MOS (SJ-MOS) transistor attains a turning-on state, and an electric current is flowed from the drain electrode 10 to the source electrode 9 through the $N^+$ silicon substrate 1, the N type impurity diffusive area 2a, the low concentration area 3a ($N^-$ silicon layer 3) of the N type, an inverting layer formed in a part opposed to the gate electrode 8 in the channel forming area 4, and the $N^+$ source area 5.

Figure 5:
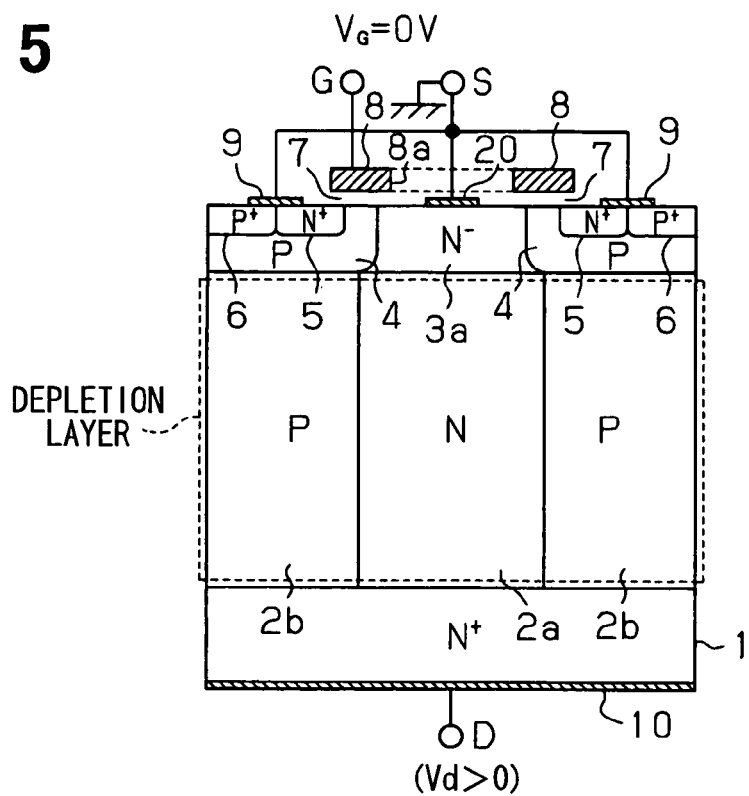

Further, as shown in FIG. 5, the source terminal (source electrode 9) is connected to the ground and a positive voltage is applied to the drain terminal (drain electrode 10). Namely, a positive bias voltage is applied as the voltage Vds between the drain and the source. Further, the gate terminal (gate electrode 8) is set to 0 volt. Namely, the voltage Vgs between the gate and the source is set to 0 volt.

In this case, both the super junction MOS (SJ-MOS) transistor and the Schottky barrier diode attain a turning-off state, and a depletion layer is formed in the silicon layer 2 (a portion in which the N type impurity diffusive area 2a and the P type impurity diffusive area 2b are adjacently alternately arranged). Thus, withstand voltage is supported by the super junction structure.

Figure 6:
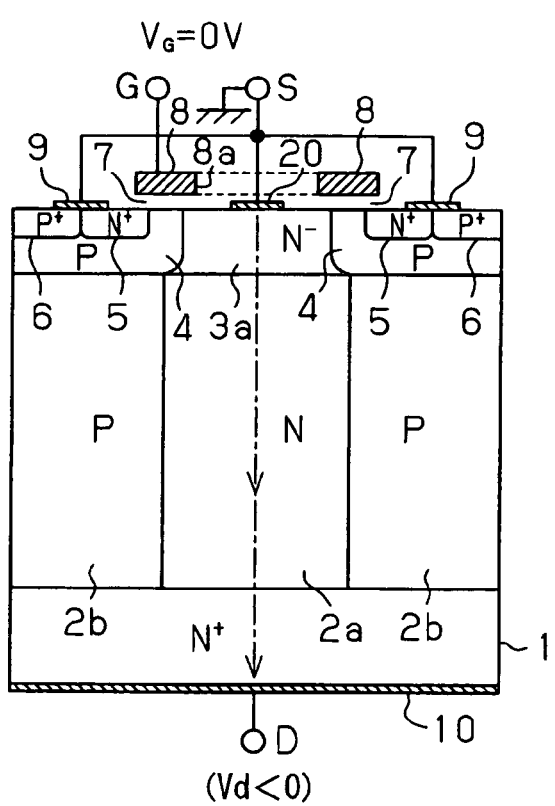

Further, as shown in FIG. 6, the source terminal (source electrode 9) is connected to the ground and a negative voltage is applied to the drain terminal (drain electrode 10). Namely, a negative bias voltage is applied as the voltage Vds between the drain and the source. Further, the gate terminal (gate electrode 8) is set to 0 volt. Namely, the voltage Vgs between the gate and the source is set to 0 volt.

In this case, only the Schottky barrier diode attains the turning-on state, and an electric current is flowed from the anode electrode 20 to the drain electrode 10 through the low concentration area 3a ($N^-$ silicon layer 3) of the N type, the N type impurity diffusive area 2a and the $N^+$ silicon substrate 1. At this time, the built-in diodes D1, D2 have high forward voltages, and are not almost turned on. In other words, the impurity concentration of the $N^-$ silicon layer 3 is set such that the forward voltage of the Schottky barrier diode becomes lower than the forward voltages of the built-in diodes (PN diodes) D1, D2 (the impurity concentration of the $N^-$ silicon layer 3 is set to be low).

Thus, high withstand voltage and low loss can be formed with respect to the transistor and the diode by setting a structure in which the MOS transistor and the Schottky barrier diode are set to be parallel and a portion for supporting the withstand voltage is commonly used in the super junction. More particularly, with respect to the diode, the forward voltage can be reduced (low loss can be set). More precisely, the Schottky barrier diode (SBD) can be integrated without increasing the area of the power MOS transistor, and the withstand voltage is supported by the super junction (SJ). The MOS transistor and the Schottky barrier diode (SBD) can be set to high withstand voltage and low resistance. Further, carrier accumulation can be reduced (short-circuit breakdown restraint and noise reduction). Further, gate capacity can be reduced by an amount for forming the opening portion 8a in the gate electrode 8.

A manufacturing method will next be explained.

Figure 7A:
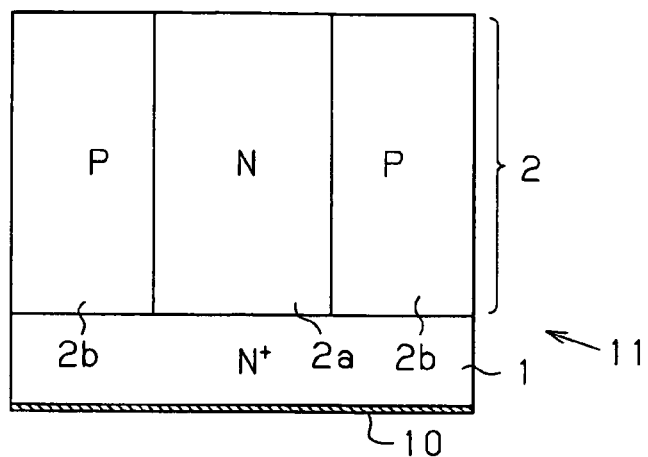
FIGS. 7A to 7C are cross sectional views explaining a method for manufacturing the device in FIG. 1.

First, as shown in FIG. 7A, an $N^+$ silicon substrate 1 is prepared and a drain electrode 10 is formed on the rear face. An N type silicon layer 2 is then formed on the $N^+$ silicon substrate 1 by an epitaxial growing method. Further, a trench is formed in the N type silicon layer 2 by a photolitho-etching process, and is buried by a P type epitaxial layer. Further, the surface is polished and flattened. Thus, a super junction substrate 11 having an N type impurity diffusive area 2a and a P type impurity diffusive area 2b adjacently alternately arranged is obtained in the silicon layer 2.

Figure 7B:
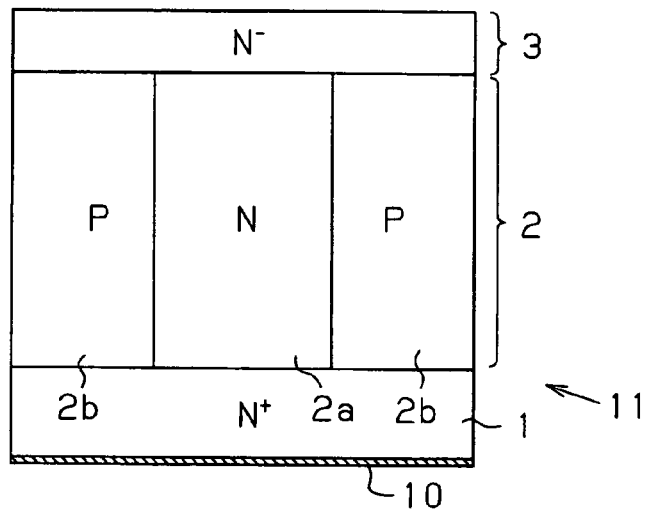
Figure 7C:
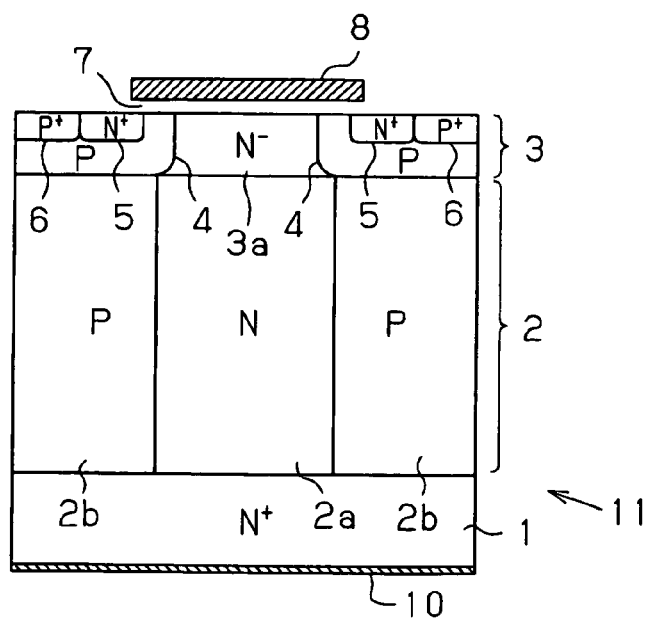

Subsequently, as shown in FIG. 7B, an $N^-$ silicon layer 3 is formed by the epitaxial growing method on the entire upper face of the super junction substrate 11 prepared in this way. Further, as shown in FIG. 7C, a planar gate electrode 8 is partially formed on the upper face of the $N^-$ silicon layer 3 through a gate oxide film 7. A P type channel forming area (P well layer) 4 and an $N^+$ source area 5 are then formed in the $N^-$ silicon layer 3 in self alignment with respect to the planar gate electrode 8. Further, a $P^+$ source contact area 6 is formed.

Figure 8A:
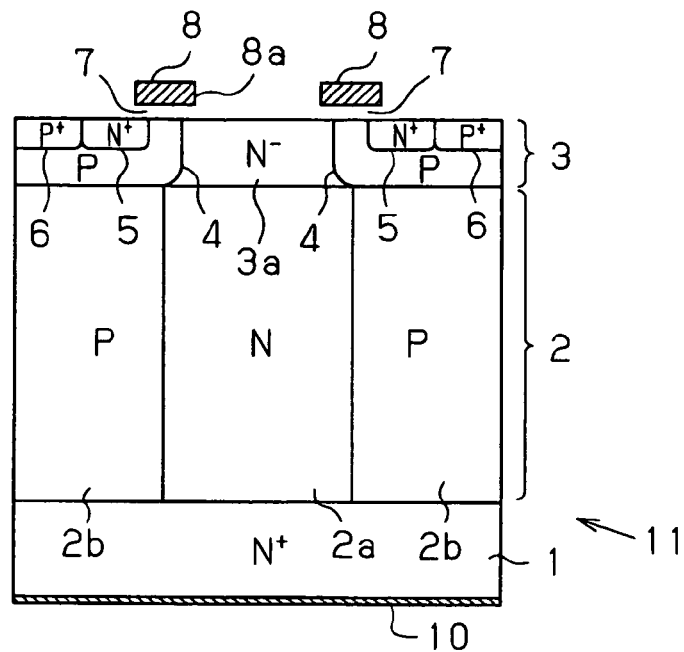
FIGS. 8A and 8B are cross sectional views explaining the method for manufacturing the device in FIG. 1.

Thereafter, as shown in FIG. 8A, an opening portion 8a is formed by removing the forming area of an anode electrode 20 constituting the Schottky barrier diode (SBD) in the planar gate electrode 8, i.e., one portion of the planar gate electrode 8 by photo lithography etching method.

Figure 8B:
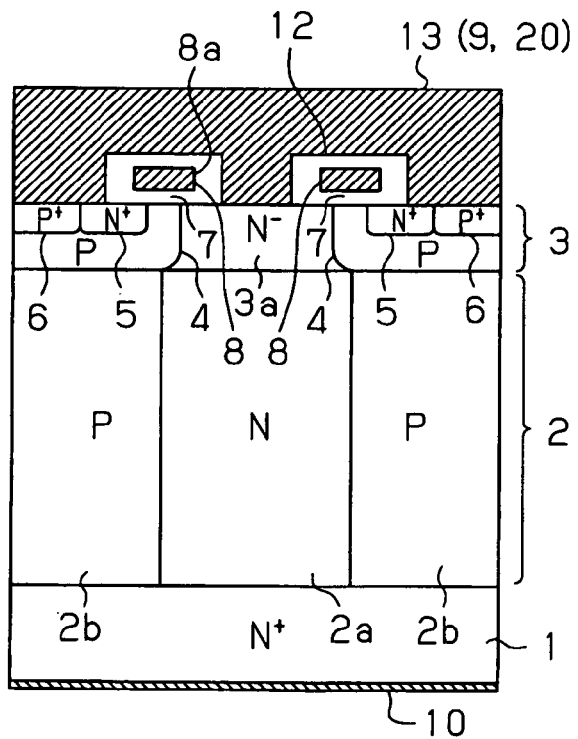

As shown in FIG. 8B, a silicon oxide film 12 as an insulating film is then formed on the entire face, and the forming area of a source electrode 9 in the silicon oxide film 12 and the forming area of the anode electrode 20 are then removed by the photo lithography etching method. An electrode 13 is formed after the upper face of the silicon layer 3 in the forming area of the source electrode 9 and the forming area of the anode electrode 20 is exposed. The electrode 13 becomes the source electrode 9 and the anode electrode 20 in FIG. 2. Thus, the semiconductor device of FIG. 2 is obtained.

Figure 9:
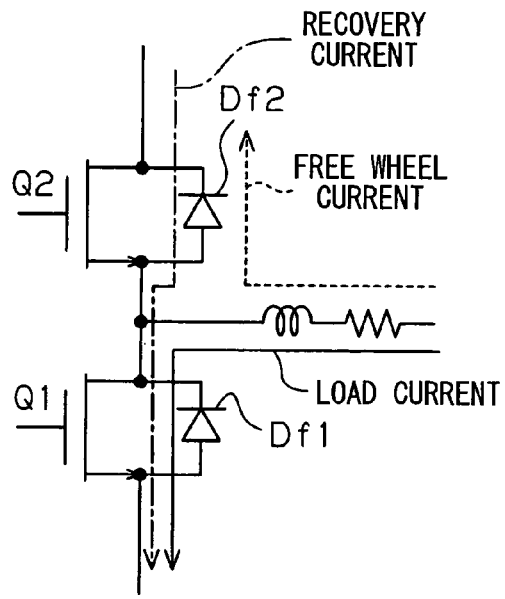
FIG. 9 is a circuit diagram showing an equivalent circuit of one phase inverter in an inverter circuit having the device in FIG. 1.
Figure 10:
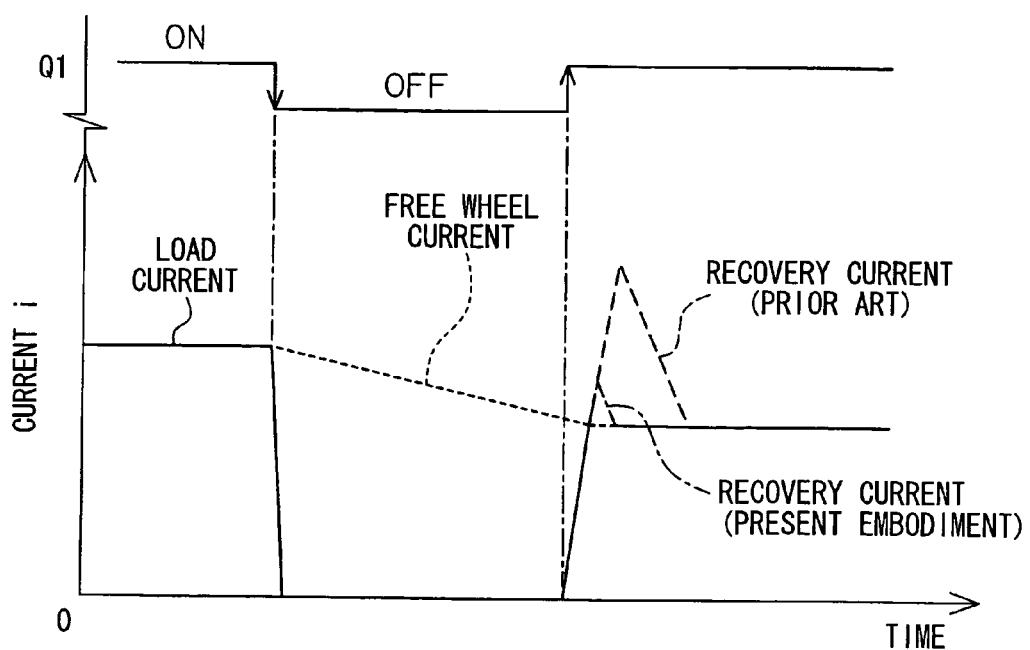
FIG. 10 is a timing chart showing the inverter in FIG. 9.

The following effects are obtained when the semiconductor device (a device for integrating SJ-MOS and SBD) of this structure is used in an inverter circuit as shown in FIG. 9. FIG. 9 shows an equivalent circuit of one phase amount of the inverter. Further, FIG. 10 is a time chart showing the respective waveforms of a load electric current, a free wheel electric current (reflux electric current) and a recovery electric current.

In FIG. 9, switching elements (MOS transistors) Q1, Q2 are connected in series between an electric power source and the ground. Integrated reflux diodes (Df1, Df2) are connected to the respective switching elements (Q1, Q2) in parallel. The load electric current is flowed by turning-on one switching element Q1 (see FIG. 10). When the switching element Q1 is turned off from this state, the free wheel electric current is flowed through the reflux diode Df2 (see FIG. 10). Further, when the switching element Q1 is turned on from this state, the recovery electric current of the reflux diode Df2 is flowed.

Here, since the Schottky barrier diode (SBD) can be formed with respect to the reflux diodes (Df1, Df2), carrier accumulation at a reverse restoring time can be restrained and the recovery electric current is reduced. Thus, short-circuit breakdown due to a passing-through electric current is also restrained.

Thus, both the power MOS transistor and the Schottky barrier diode (SBD) can be set to high withstand voltage and low loss. As its result, the power MOS transistor and a free wheel diode in a high withstand voltage inverter can be used as an integrated low loss device so that a system can be made compact and reduced in loss. In other words, the Schottky barrier diode (SBD) can be built-in without increasing the area of the power MOS transistor, and the number of parts can be reduced.

The following effects can be obtained in accordance with the above embodiment mode.

(1) The anode electrode 20 constituting the Schottky barrier diode is arranged in a part exposing the low concentration area 3a of the N type on the upper face of the silicon layer (low concentration semiconductor layer) 3, and the super junction MOS transistor and the Schottky barrier diode are integrated. Thus, since the Schottky barrier diode of the super junction structure is integrated with the super junction MOS transistor, the diode can be set to high withstand voltage and low loss, and this diode and the MOS transistor of high withstand voltage and low loss can be integrated.

(2) In particular, the anode electrode 20 constituting the Schottky barrier diode is arranged in a part exposing the low concentration area 3a of the N type between the adjacent channel forming areas 4 on the upper face of the N⁻ silicon layer 3 within the transistor cell forming area. The super junction MOS transistor and the Schottky barrier diode are then integrated. Thus, the Schottky barrier diode can be integrated with the super junction MOS transistor of high withstand voltage and low loss without increasing an area. As its result, the diode can be set to high withstand voltage and low loss, and this diode and the MOS transistor of high withstand voltage and low loss can be integrated in a small area.

Therefore, the opening portion 8a is formed in the common gate electrode 8 within each cell within the transistor cell forming area, and the anode electrode 20 is formed in the opening portion 8a. Accordingly, the anode electrode 20 can be easily arranged in the transistor cell forming area, which is preferable from the viewpoint that no increase of an area is caused.

A modified example will next be explained.

Figure 11:
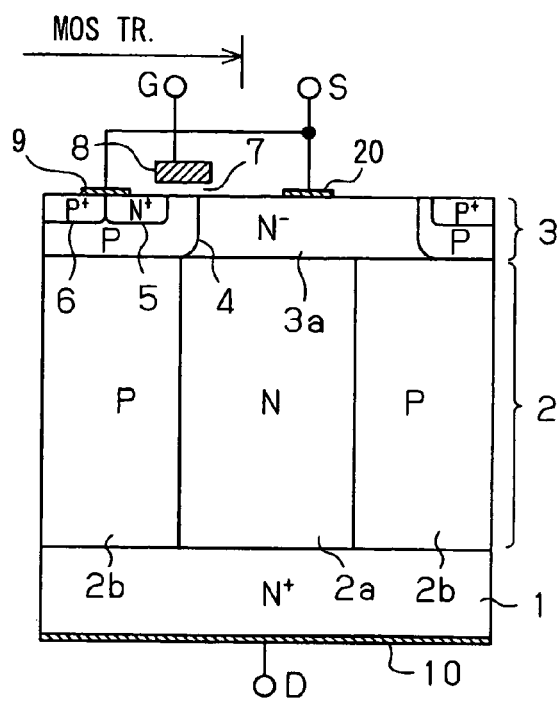
FIG. 11 is a cross sectional view showing a modification of the device in FIG. 1.

In FIG. 2, the anode electrode 20 of SBD is formed on the surface in the N type low concentration area 3a (N⁻ silicon layer 3) sandwiched by the channel forming area 4 so as to integrate the super junction MOS (SJ-MOS) and the Schottky barrier diode (SBD) without increasing an area within a cell. Alternatively, as shown in FIG. 11, with respect to the channel forming area 4 of an end portion of the transistor cell forming area, the anode electrode 20 of SBD may be also formed on the surface in the N⁻ silicon layer 3 in its vicinity.

Figure 12:
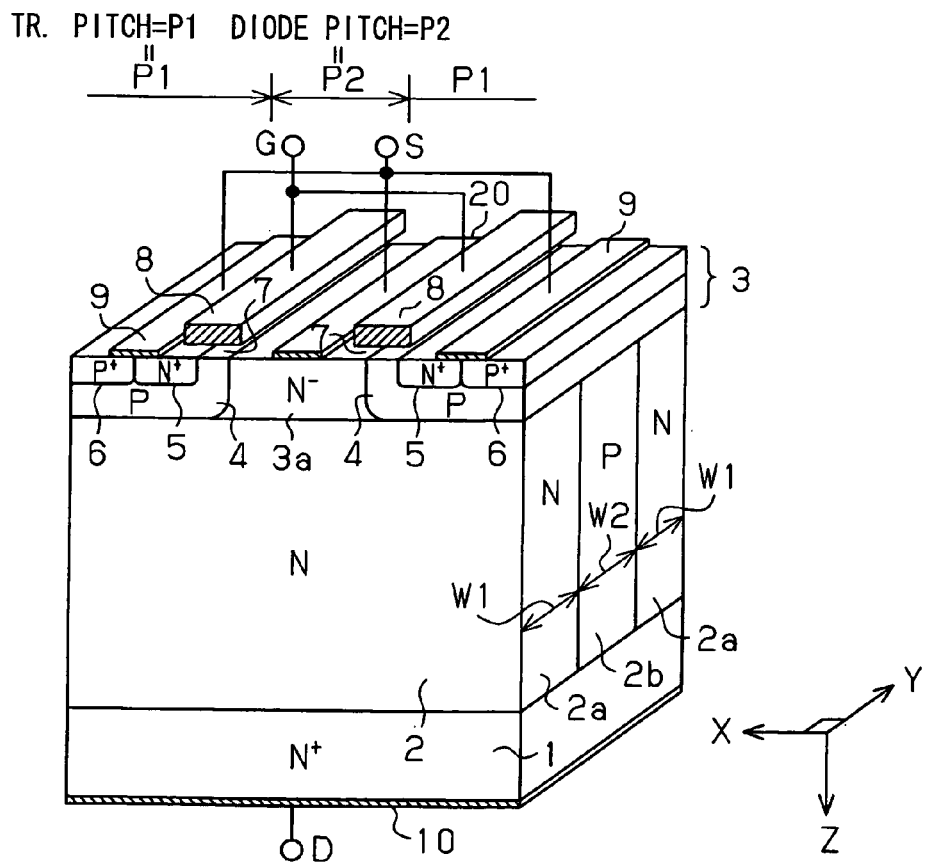
FIG. 12 is a schematic perspective view showing a second modification of the device in FIG. 1.

Further, as shown in FIG. 12 instead of FIG. 1, the N type impurity diffusive area 2a and the P type impurity diffusive area 2b are adjacently alternately arranged in the silicon layer 2, but extending directions of the gate electrode 8 and the anode electrode 20 may be set to be perpendicular to the extending directions of these areas 2a, 2b (column). Namely, in FIG. 1, the impurity diffusive areas 2a, 2b (column), the gate electrode 8 and the anode electrode 20 are extended in the same Y-direction. However, in FIG. 12, the impurity diffusive areas 2a, 2b (column) are extended in the X-direction, and the gate electrode 8 and the anode electrode 20 are extended in the Y-direction.

Thus, widths W1, W2 of the areas 2a, 2b (column) and pitches P1, P2 of the MOS transistor and the Schottky barrier diode can be independently set (designed).

Figure 13:
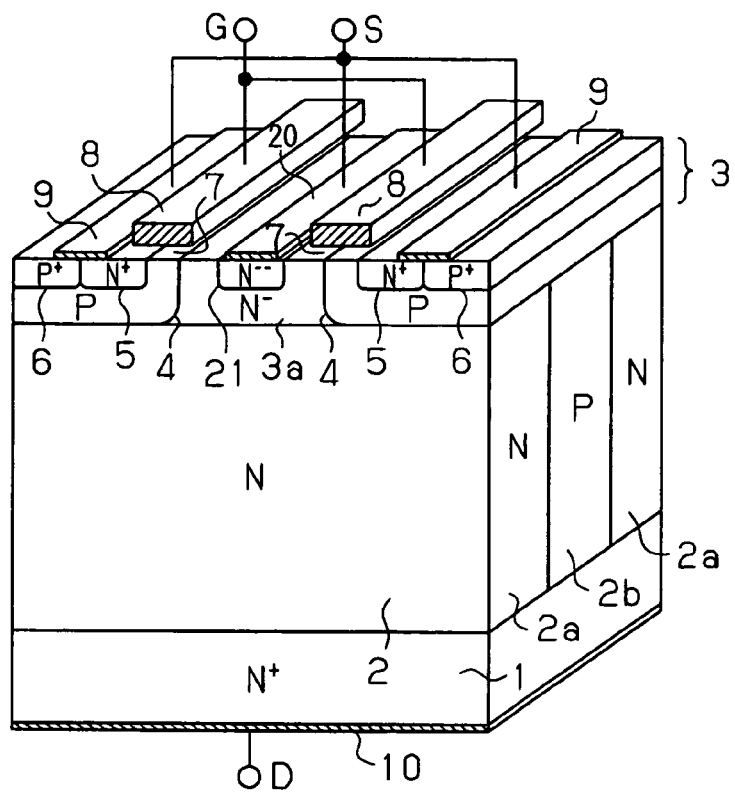
FIG. 13 is a schematic perspective view showing a third modification of the device in FIG. 1.

Further, as shown in FIG. 13 instead of FIG. 12, a contact area 21 of the N type having concentration further lower than that of the low concentration area 3a may be also arranged in a portion coming in contact with the anode electrode 20 in a part exposing the low concentration area 3a of the N type on the upper face of the N⁻ silicon layer 3. Thus, a leak electric current of the Schottky barrier diode can be restrained, and it is possible to reconcile resistance of the MOS transistor and a leak reduction of SBD.

Figure 14:
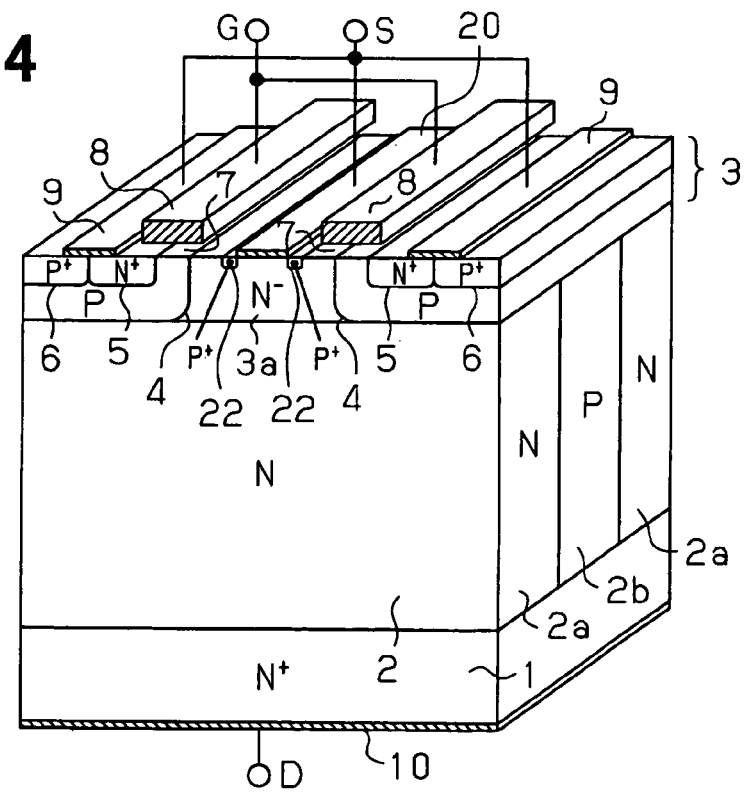
FIG. 14 is a schematic perspective view showing a fourth modification of the device in FIG. 1.

Further, as shown in FIG. 14 instead of FIG. 12, a P⁺ guard ring area 22 may be also formed so as to surround a portion coming in contact with the anode electrode 20 in a part exposing the low concentration area 3a on the upper face of the N⁻ silicon layer 3. Thus, withstand voltage can be improved.

Figure 28:
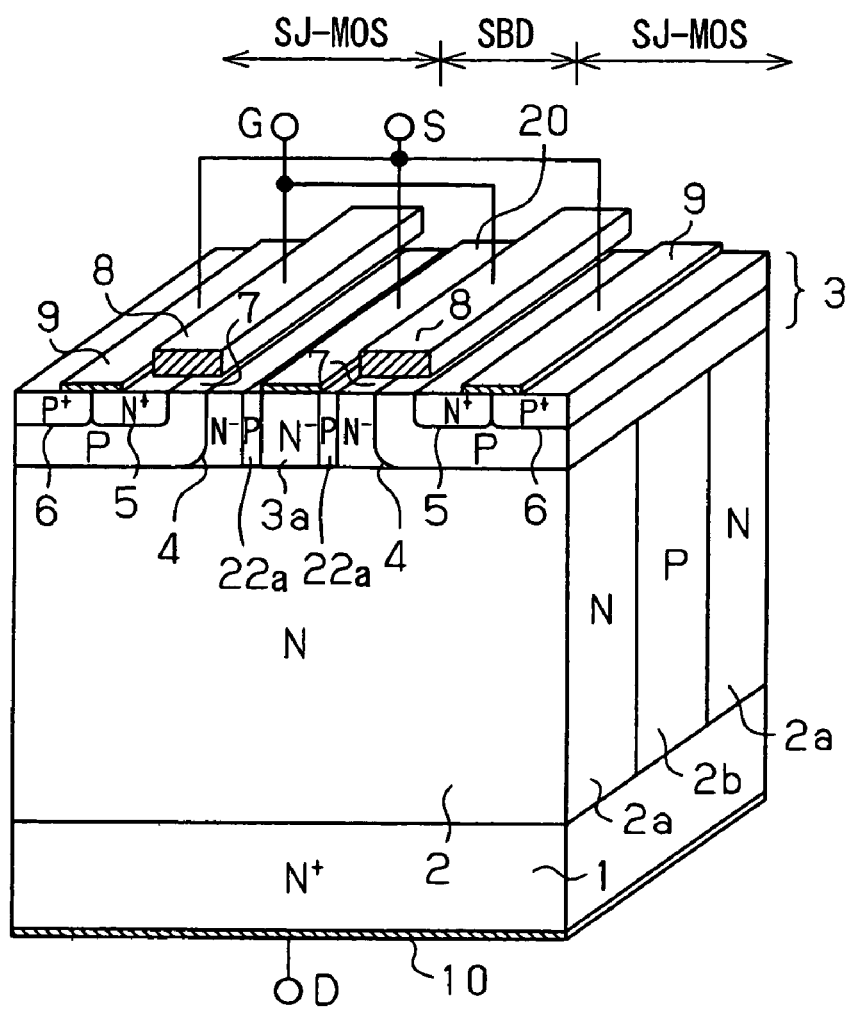
FIG. 28 is a schematic perspective view showing a fifth modification of the device in FIG. 1.

Furthermore, as shown in FIG. 28 instead of FIG. 14, a P guard ring area 22a may reach the silicon layer 2. In this case, the P guard ring area 22a in FIG. 28 is deeper than the P⁺ guard ring area 22 in FIG. 14. Thus, the deeper guard-ring structure enables relaxation of the electric field under a Schottky barrier diode (SBD), because the deep structure enables forming long depletion layer than the shallow guard-ring structure. Further, when the guard-ring area 22a has the same depth and the same doping concentration of the channel forming area 4, the forming process of the guard-ring area 22a can be simplified. Furthermore, since the deeper guard-ring structure enables relaxation of the electric field under the SBD, the PN columns 2a, 2b under the SBD can be depleted before the SBD breakdown, so that this SBD structure can have high breakdown voltage. The leakage current can be reduced because the deeper guard-ring structure enables relaxation of the electric field under the SBD. Further, the manufacturing cost can be cut because the forming process of the guard-ring area 22a can be simplified.

Next, a second embodiment mode will be explained in accordance with the drawings with different points from the first embodiment mode as a center.

Figure 15:
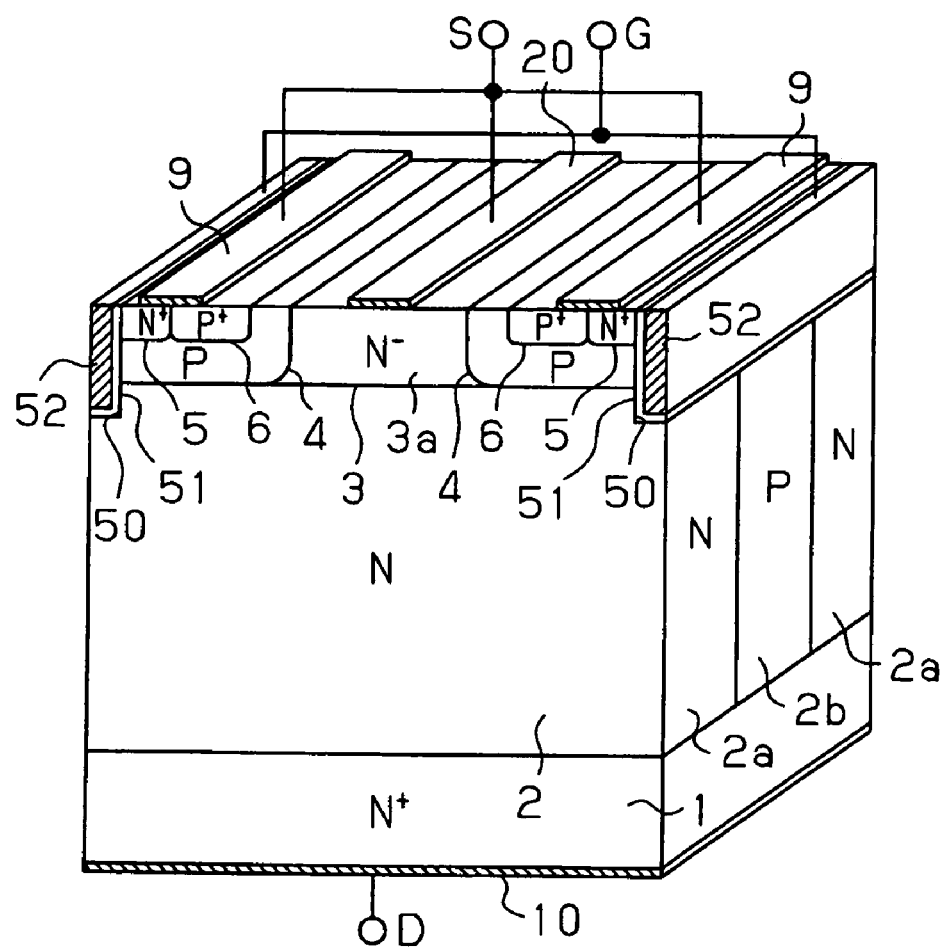
FIG. 15 is a schematic perspective view showing another semiconductor device.

FIG. 15 shows a perspective view of a semiconductor device in this embodiment mode instead of FIG. 12.

In FIG. 12, the planar gate electrode 8 is used as the gate electrode. However, in this embodiment mode of FIG. 15, a trench gate electrode 52 is used as the gate electrode (it is set to a trench gate type). More particularly, a trench 50 is dug from the upper face of the N⁻ silicon layer 3. This trench 50 passes through the N⁺ source area 5 and the channel forming area 4, and reaches the N type silicon layer 2. A gate electrode 52 is arranged on the inner face of the trench 50 through a gate oxide film 51 as a gate insulating film. Accordingly, an inverting layer is formed in a part opposed to the gate electrode 52 in the channel forming area 4.

Further, an anode electrode 20 constituting the Schottky barrier diode is arranged in a part exposing the low concentration area 3a of the N type on the upper face of the N⁻ silicon layer (low concentration semiconductor layer) 3. The super junction MOS transistor and the Schottky barrier diode are integrated. Accordingly, since the Schottky barrier diode of the super junction structure is integrated with the super junction MOS transistor, the diode can be set to high withstand voltage and low loss, and this diode and the MOS transistor of high withstand voltage and low loss can be integrated. In particular, the anode electrode 20 constituting the Schottky barrier diode is arranged in the part exposing the low concentration area 3a of the N type between the adjacent channel forming areas 4 on the upper face of the N⁻ silicon layer 3 within the transistor cell forming area. The super junction MOS transistor and the Schottky barrier diode are integrated. Thus, the Schottky barrier diode can be integrated with the super junction MOS transistor of high withstand voltage and low loss without increasing an area. As its result, the diode can be set to high withstand voltage and low loss, and this diode and the MOS transistor of high withstand voltage and low loss can be integrated in a small area.

Further, the impurity concentration of the N⁻ silicon layer 3 is set such that the forward voltage of the Schottky barrier diode becomes lower than the forward voltage of a built-in PN diode. Further, the anode electrode 20 and the source electrode 9 are short-circuited within a chip. Further, extending directions of the gate electrode 52 and the anode electrode 20 are perpendicular to the extending directions of the impurity diffusive area 2a of the N type and the impurity diffusive area 2b of the P type as a drift area in the silicon layer 2.

A manufacturing method will next be explained.

Figure 16A:
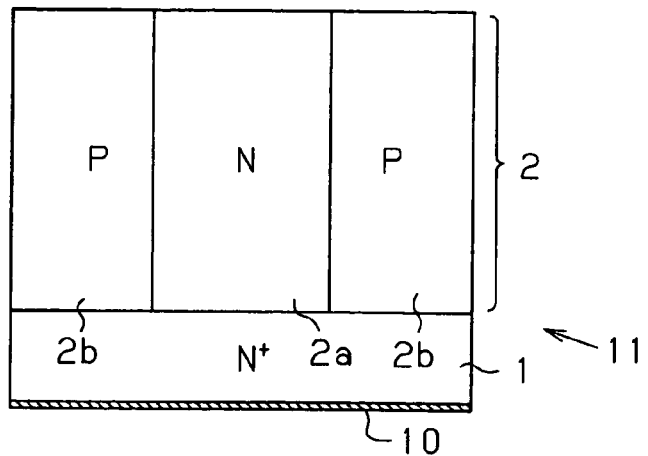
FIGS. 16A to 16C are cross sectional views explaining a method for manufacturing the device in FIG. 15.

First, as shown in FIG. 16A, an N⁺ silicon substrate 1 is prepared, and a drain electrode 10 is formed on the rear face. An N type silicon layer 2 is laminated on the N⁺ silicon substrate 1 by the epitaxial growing method. Further, a trench is formed in the N type silicon layer 2 by a photolitho-etching process, and is buried by a P type epitaxial layer. Further, the surface is polished and flattened. Thus, a super junction substrate 11 having the N type impurity diffusive area 2a and the P type impurity diffusive area 2b adjacently alternately arranged is obtained in the silicon layer 2.

Figure 16B:
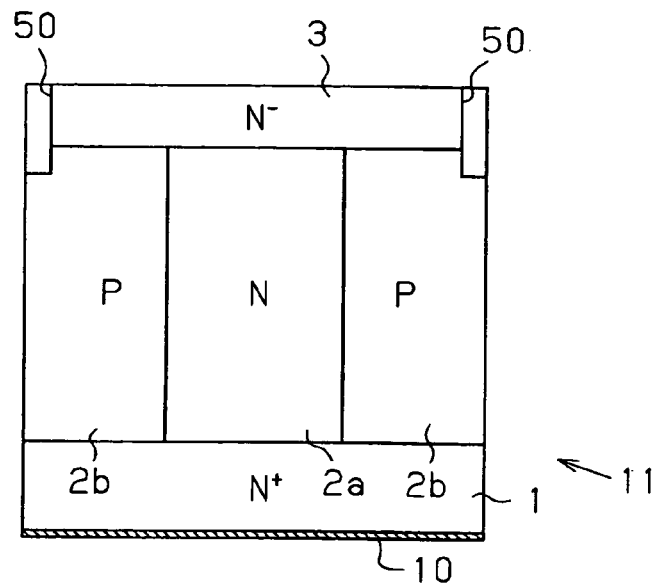
Figure 16C:
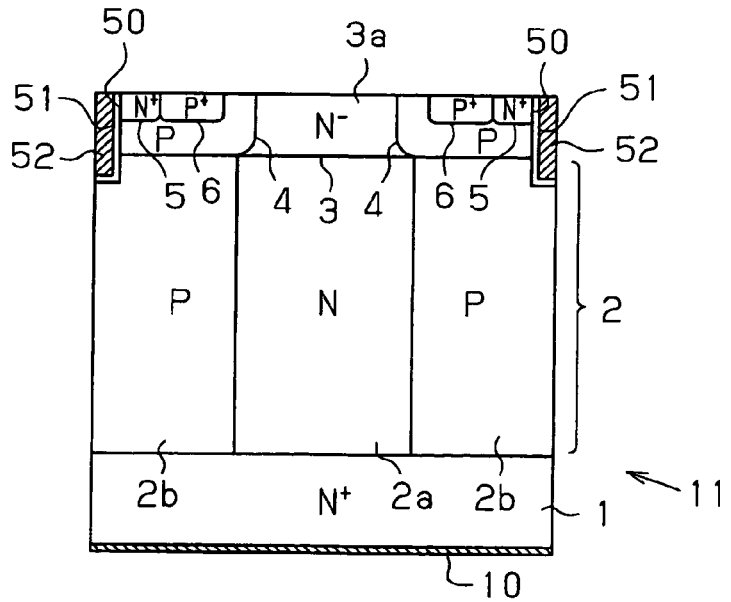

Subsequently, as shown in FIG. 16B, an N⁻ silicon layer 3 is formed by the epitaxial growing method on the upper face of the super junction substrate 11 prepared in this way. Further, a trench 50 is formed in one portion of the silicon layer 3. Subsequently, as shown in FIG. 16C, a trench gate electrode 52 is buried through a gate oxide film 51. Thereafter, a P type channel forming area 4 and an N type source area 5 are formed in the silicon layer 3 in self alignment with respect to the trench gate electrode 52, and a P type source contact area 6 is formed. An N⁻ area 3a is left between the areas 4 in forming the channel forming area 4.

Figure 17A:
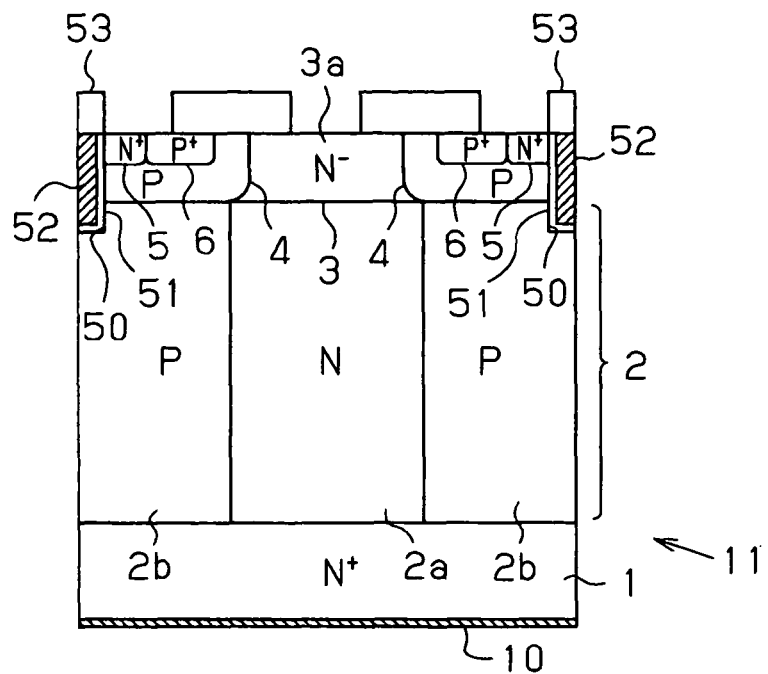
FIGS. 17A and 17B are cross sectional views explaining the method for manufacturing the device in FIG. 15.
Figure 17B:
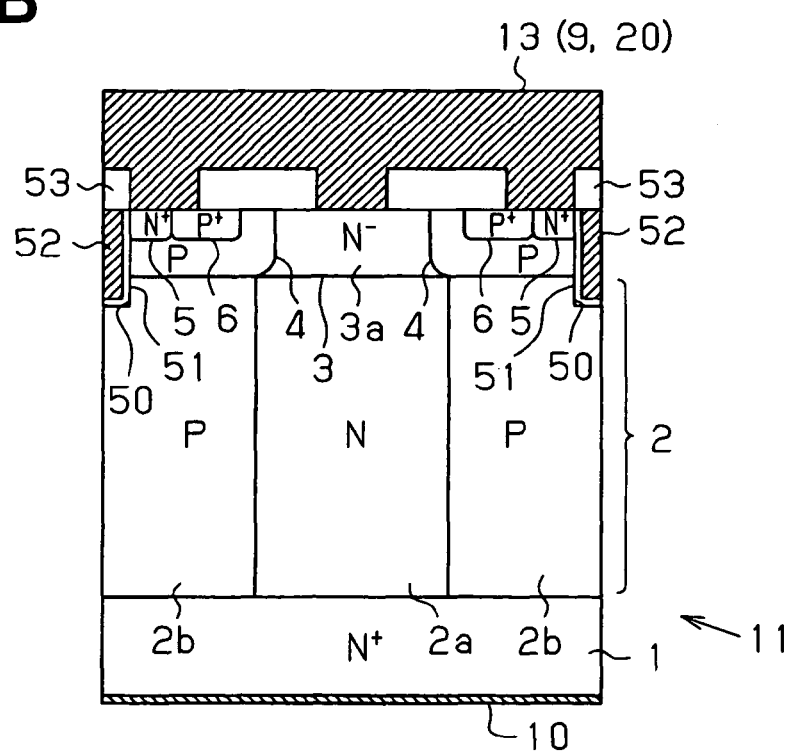

As shown in FIG. 17A, a silicon oxide film 53 as an insulating film is formed on the entire face. Further, the forming area of a source electrode 9 in the silicon oxide film 53 and the forming area of an anode electrode 20 constituting the Schottky barrier diode are removed by photo lithograph etching method. Thus, the upper face of the silicon layer 3 in the forming area of the source electrode 9 and the forming area of the anode electrode 20 is exposed. Thereafter, an electrode 13 is formed as shown in FIG. 17B. The electrode 13 becomes the source electrode 9 and the anode electrode 20 in FIG. 15. Thus, the semiconductor device of FIG. 15 is obtained.

In this embodiment mode, as explained by using FIG. 13, a contact area 21 of the N type having concentration further lower than that of the low concentration area 3a may be also arranged in a portion coming in contact with the anode electrode 20 in a part exposing the low concentration area 3a of the N type on the upper face of the silicon layer 3. Further, in this embodiment mode, as explained by using FIG. 14, a guard ring area 22 of the P type may be also formed so as to surround the portion coming in contact with the anode electrode 20 in the part exposing the low concentration area 3a of the N type on the upper face of the silicon layer 3.

Figure 18:
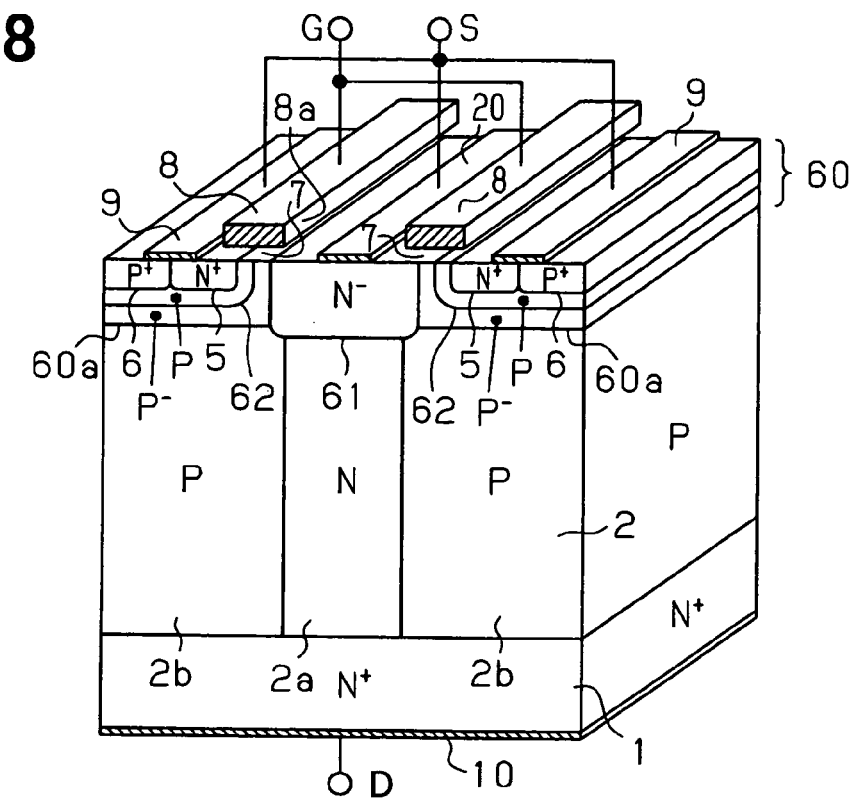
FIG. 18 is a schematic perspective view showing further another semiconductor device.

FIG. 18 shows a perspective view of a semiconductor device in a third embodiment mode instead of FIG. 1.

In a silicon layer (first semiconductor layer) 2 laminated on an N⁺ silicon substrate 1, an N type impurity diffusive area 2a and a P type impurity diffusive area 2b as a drift area are adjacently alternately arranged. A P type silicon layer (second semiconductor layer) 60 as a low concentration channel forming area is laminated on the silicon layer 2. An N well layer 61 reaching the N type impurity diffusive area 2a is formed in the silicon layer 60. A P type high concentration channel forming area 62 is formed in a surface layer portion of the silicon layer 60. An N⁺ source area 5 and a P⁺ source contact area 6 are formed within the high concentration channel forming area 62. A gate electrode 8 is arranged through a gate oxide film 7 on a part exposing the high concentration channel forming area 62 and a low concentration channel forming area 60a on the upper face of the silicon layer 60. A source electrode 9 is arranged in a part exposing the source area 5 and the source contact area 6 on the upper face of the silicon layer 60. Further, a drain electrode 10 is arranged on the rear face of the N⁺ silicon substrate 1. An anode electrode 20 constituting the Schottky barrier diode is arranged in a part exposing the well layer 61 on the upper face of the silicon layer 60. A super junction MOS transistor and the Schottky barrier diode are integrated. Accordingly, since the Schottky barrier diode of a super junction structure is integrated with the super junction MOS transistor, the diode can be set to high withstand voltage and low loss, and this diode and the MOS transistor of high withstand voltage and low loss can be integrated. In particular, the anode electrode 20 constituting the Schottky barrier diode is arranged in a part exposing the well layer 61 of the N type between adjacent high concentration channel forming area 62 and low concentration channel forming area 60a on the upper face of the silicon layer 60 within a transistor cell forming area. The super junction MOS transistor and the Schottky barrier diode are integrated. Thus, the Schottky barrier diode can be integrated with the super junction MOS transistor of high withstand voltage and low loss without causing an increase of an area. As its result, the diode can be set to high withstand voltage and low loss, and this diode and the MOS transistor of high withstand voltage and low loss can be integrated in a small area.

Further, an opening portion 8a is formed in the common gate electrode 8 within each cell within the transistor cell forming area, and the anode electrode 20 is formed in the opening portion 8a. Further, the impurity concentration of the well layer 61 is set such that the forward voltage of the Schottky barrier diode becomes lower than the forward voltage of a built-in PN diode. Further, the anode electrode 20 and the source electrode 9 are short-circuited within a chip.

As an operation, only the super junction MOS transistor attains a turning-on state by adjusting a gate electric potential in a state in which a positive bias voltage is applied as the voltage between the drain and the source. An electric current is then flowed from the drain electrode 10 to the source electrode 9 through the substrate 1, the drift area (2a), the well layer 61, an inverting layer formed in a part opposed to the gate electrode 8 in the high concentration and low concentration channel forming areas 62, 60a, and the source area 5. Further, when the voltage between the gate and the source is set to 0 volt in a state in which a positive bias voltage is applied as the voltage between the drain and the source, both the super junction MOS transistor and the Schottky barrier diode attain a turning-off state, and a depletion layer is formed in the silicon layer 2 (a portion in which the impurity diffusive area 2a of the N type and the impurity diffusive area 2b of the P type are adjacently alternately arranged). Thus, withstand voltage is supported by the super junction structure. Further, when a negative bias voltage is applied as the voltage between the drain and the source and the voltage between the gate and the source is set to 0 volt, only the Schottky barrier diode attains the turning-on state, and an electric current is flowed from the anode electrode 20 through the well layer 61, the drift area (2b) and the substrate 1.

Thus, high withstand voltage and low loss can be formed by setting a structure in which the MOS transistor and the Schottky barrier diode are set to be parallel and a portion for supporting the withstand voltage is commonly used in the super junction.

A manufacturing method will next be explained.

Figure 19A:
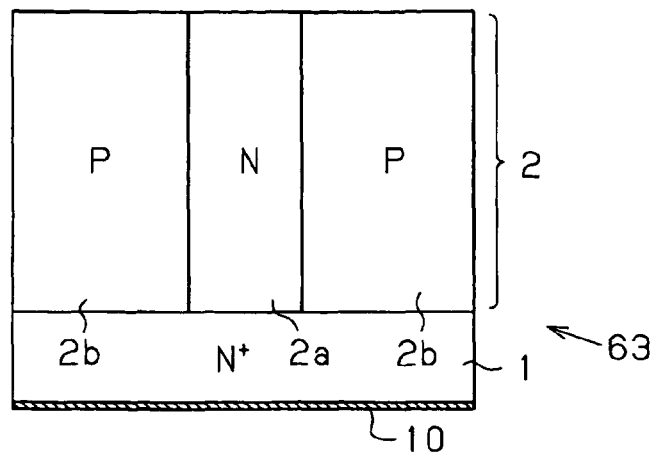
FIGS. 19A to 19C are cross sectional views explaining a method for manufacturing the device in FIG. 18.

First, as shown in FIG. 19A, an $N^+$ silicon substrate 1 is prepared and a drain electrode 10 is formed on the rear face. An N type silicon layer 2 is then laminated on the $N^+$ silicon substrate 1 by the epitaxial growing method. Further, a trench is formed in the N type silicon layer 2 by a photo lithography etching process, and is buried by a P type epitaxial layer. Further, the surface is polished and flattened. Thus, a super junction substrate 63 having an N type impurity diffusive area 2a and a P type impurity diffusive area 2b adjacently alternately arranged is obtained in the silicon layer 2.

Figure 19B:
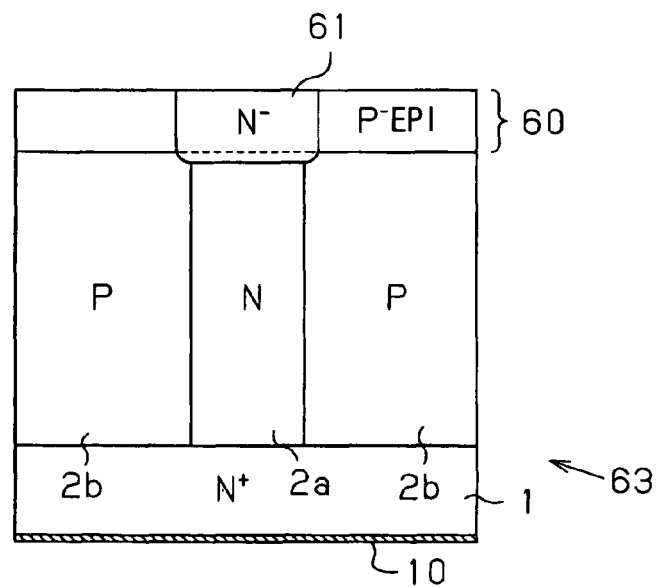

Subsequently, as shown in FIG. 19B, a $P^-$ silicon layer 60 as a low concentration channel forming area is formed by the epitaxial growing method on the upper face of the super junction substrate 63 prepared in this way. Further, a well layer 61 of the N type reaching the N type impurity diffusive area 2a is formed in the $P^-$ silicon layer 60.

Figure 19C:
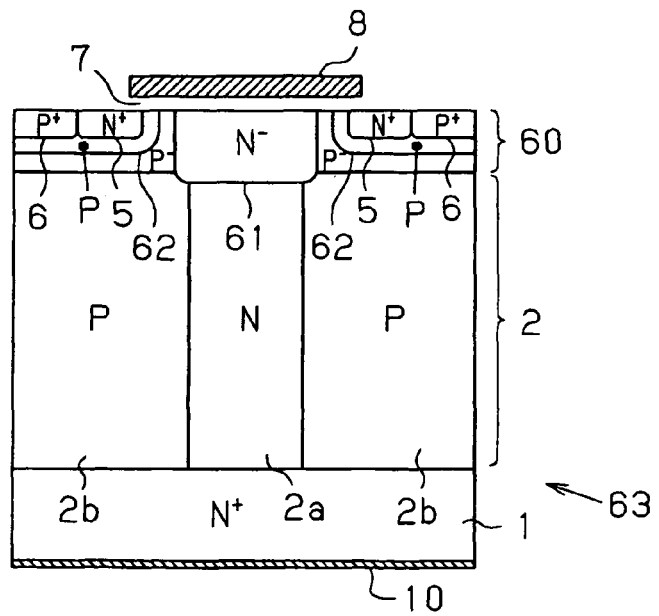

Subsequently, as shown in FIG. 19C, a planar gate electrode 8 is partially formed on the upper face of an $N^-$ silicon layer 60 through a gate oxide film 7. A P type high concentration channel forming area 62 and an N type source area 5 are then formed in the $N^-$ silicon layer 60 in self alignment with respect to the planar gate electrode 8, and a P type source contact area 6 is formed.

Figure 20A:
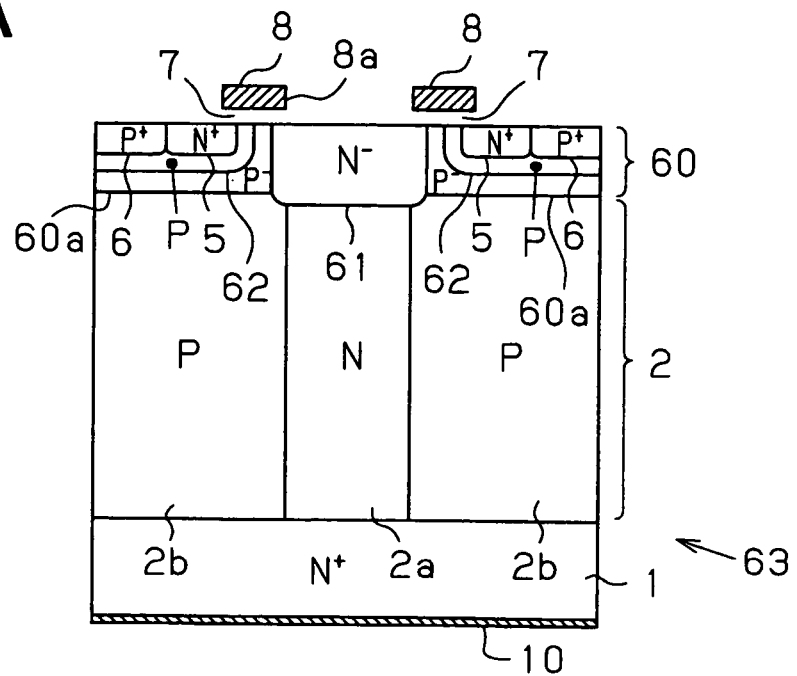
FIGS. 20A and 20B are cross sectional views explaining the method for manufacturing the device in FIG. 18.
Figure 20B:
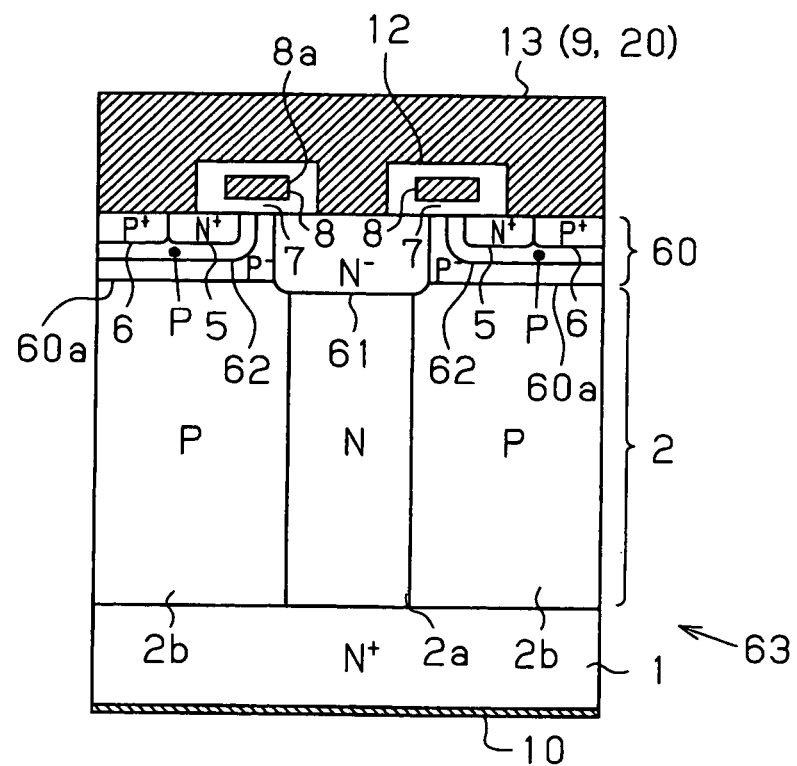

Thereafter, as shown in FIG. 20A, an opening portion 8a is formed by removing the forming area of an anode electrode 20 constituting the Schottky barrier diode (SBD) in the planar gate electrode 8, i.e., one portion of the planar gate electrode 8 by photo lithography etching method. As shown in FIG. 20B, a silicon oxide film 12 as an insulating film is then formed on the entire face, and the forming area of a source electrode 9 in the silicon oxide film 12 and the forming area of the anode electrode 20 are removed by the photo lithography etching method. An electrode 13 is formed after the upper face of a silicon layer 60 in the forming area of the source electrode 9 and the forming area of the anode electrode 20 is exposed. The electrode 13 becomes the source electrode 9 and the anode electrode 20 in FIG. 18. Thus, the semiconductor device shown in FIG. 18 is obtained.

In this embodiment mode, as explained by using FIG. 12, it may be also constructed such that extending directions of the gate electrode 8 and the anode electrode 20 are perpendicular to the extending directions of the impurity diffusive area 2a of the N type and the impurity diffusive area 2b of the P type as a drift area in the silicon layer (first semiconductor layer) 2. Further, in this embodiment mode, as explained by using FIG. 13, a contact area 21 of the N type having concentration further lower than that of the well layer 61 may be also arranged in a portion coming in contact with the anode electrode 20 in a part exposing the well layer 61 of the N type on the upper face of the silicon layer (second semiconductor layer) 60. Further, in this embodiment mode, as explained by using FIG. 14, a guard ring area 22 of the P type may be also formed so as to surround the portion coming in contact with the anode electrode 20 in the part exposing the well layer 61 of the N type on the upper face of the silicon layer 60.

Figure 21:
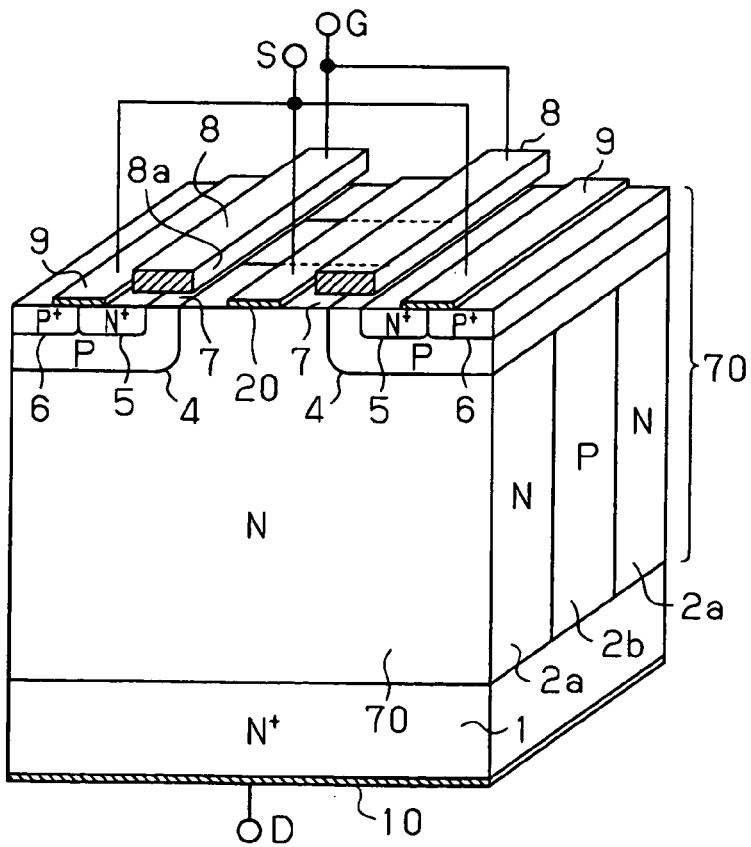
FIG. 21 is a schematic perspective view showing another semiconductor device.

FIG. 21 shows a perspective view of a semiconductor device in a foruth embodiment mode instead of FIG. 12.

In this embodiment mode, a channel forming area (P well layer) 4 of the P type, an $N^+$ source area 5 and a $P^+$ area 6 for a contact are directly formed in an N type silicon layer 70 without arranging the surface $N^-$ layer 3 in FIG. 12.

In the silicon layer (semiconductor layer) 70 laminated on an $N^+$ silicon substrate 1, an N type impurity diffusive area 2a and a P type impurity diffusive area 2b as a drift area are adjacently alternately arranged. Further, the P type channel forming area 4 is formed in a surface layer portion on the upper face of the silicon layer 70. The N type source area 5 and the P type source contact area 6 are formed within the channel forming area 4. A gate electrode 8 is arranged through a gate oxide film 7 on a part exposing the channel forming area 4 on the upper face of the silicon layer 70. A source electrode 9 is arranged in a part exposing the source area 5 and the source contact area 6 on the upper face of the silicon layer 70, and a drain electrode 10 is arranged on the rear face of the substrate 1. An anode electrode 20 constituting the Schottky barrier diode is arranged in a part exposing the impurity diffusive area 2a of the N type as a drift area on the upper face of the silicon layer 70. A super junction MOS transistor and the Schottky barrier diode are integrated. Accordingly, since the Schottky barrier diode of a super junction structure is integrated with the super junction MOS transistor, the diode can be set to high withstand voltage and low loss, and this diode and the MOS transistor of high withstand voltage and low loss can be integrated. In particular, the anode electrode 20 constituting the Schottky barrier diode is arranged in the part exposing the impurity diffusive area 2a of the N type as the drift area between the adjacent channel forming areas 4 on the upper face of the silicon layer 70 within a transistor cell forming area. The super junction MOS transistor and the Schottky barrier diode are integrated. Thus, the Schottky barrier diode can be integrated with the super junction MOS transistor of high withstand voltage and low loss without increasing an area. As its result, the diode can be set to high withstand voltage and low loss, and this diode and the MOS transistor of high withstand voltage and low loss can be integrated in a small area.

Further, an opening portion 8a is formed in the common gate electrode 8 within each cell within the transistor cell forming area, and the anode electrode 20 is formed in the opening portion 8a. Further, the impurity concentration of the impurity diffusive area 2a of the N type as the drift area is set such that the forward voltage of the Schottky barrier diode becomes lower than the forward voltage of a built-in PN diode. Further, the anode electrode 20 and the source electrode 9 are short-circuited within a chip. Further, extending directions of the gate electrode 8 and the anode electrode 20 are perpendicular to the extending directions of the impurity diffusive area 2a of the N type and the impurity diffusive area 2b of the P type as the drift area in the silicon layer 70.

As an operation, only the super junction MOS transistor attains a turning-on state by adjusting a gate electric potential in a state in which a positive bias voltage is applied as the voltage between the drain and the source. An electric current is then flowed from the drain electrode 10 to the source electrode 9 through the substrate 1, the drift area (2a), an inverting layer formed in a part opposed to the gate electrode 8 in the channel forming area 4, and the source area 5. Further, when the voltage between the gate and the source is set to 0 volt in a state in which a positive bias voltage is applied as the voltage between the drain and the source, both the super junction MOS transistor and the Schottky barrier diode attain a turning-off state, and a depletion layer is formed in the silicon layer 70 (a portion in which the impurity diffusive area 2a of the N type and the impurity diffusive area 2b of the P type are adjacently alternately arranged). Thus, withstand voltage is supported by the super junction structure. Further, when a negative bias voltage is applied as the voltage between the drain and the source and the voltage between the gate and the source is set to 0 volt, only the Schottky barrier diode attains the turning-on state, and an electric current is flowed from the anode electrode 20 through the drift area (2a) and the substrate 1.

Thus, high withstand voltage and low loss can be formed by setting a structure in which the MOS transistor and the Schottky barrier diode are set to be parallel and a portion for supporting the withstand voltage is commonly used in the super junction.

A manufacturing method will next be explained.

Figure 22A:
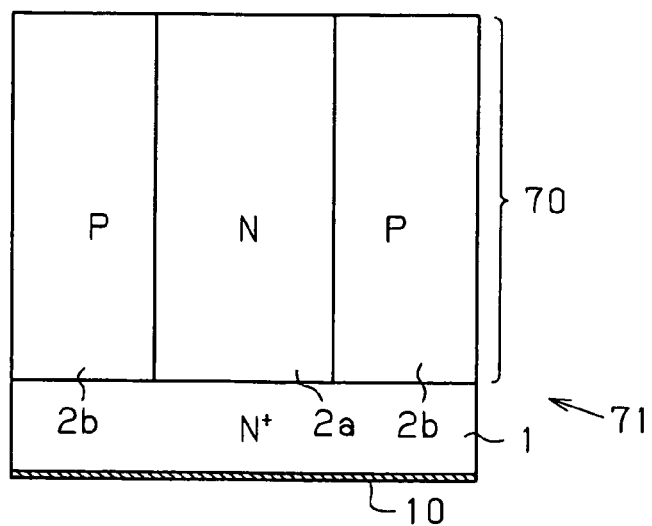
FIGS. 22A to 22C are cross sectional views explaining a method for manufacturing the device in FIG. 21.

First, as shown in FIG. 22A, an $N^+$ silicon substrate 1 is prepared, and a drain electrode 10 is formed on the rear face. An N type silicon layer 70 is laminated on the $N^+$ silicon substrate 1 by the epitaxial growing method. Further, a trench is formed in the N type silicon layer 70 by a photo lithography etching process, and is buried in a P type epitaxial layer. Further, the surface is polished and flattened. Thus, a super junction substrate 71 having an N type impurity diffusive area 2a and a P type impurity diffusive area 2b adjacently alternately arranged is obtained in the silicon layer 70.

Figure 22B:
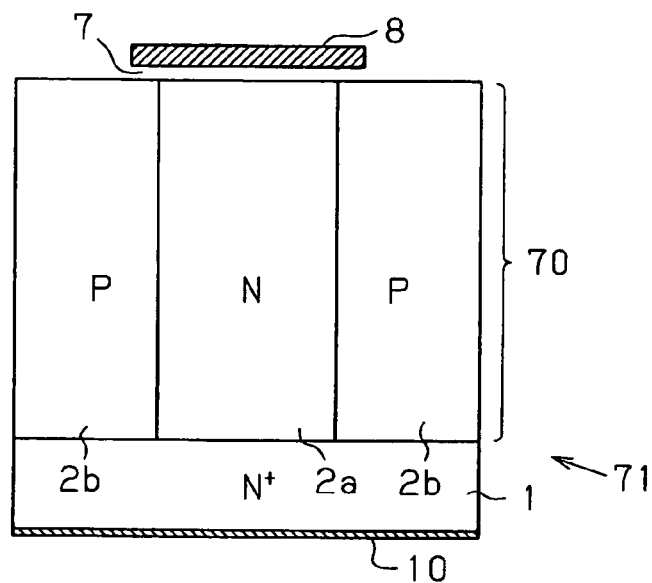

Subsequently, as shown in FIG. 22B, a planar gate electrode 8 is partially formed through a gate oxide film 7 on the upper face of the super junction substrate 71 prepared in this way.

Figure 22C:
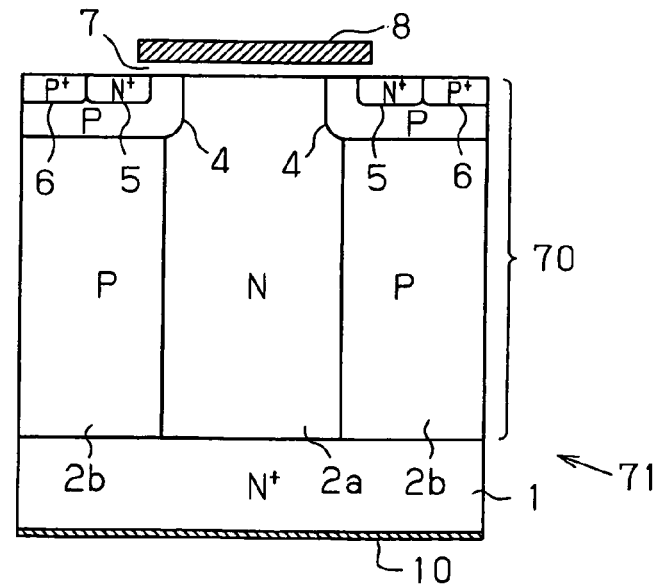
Figure 23A:
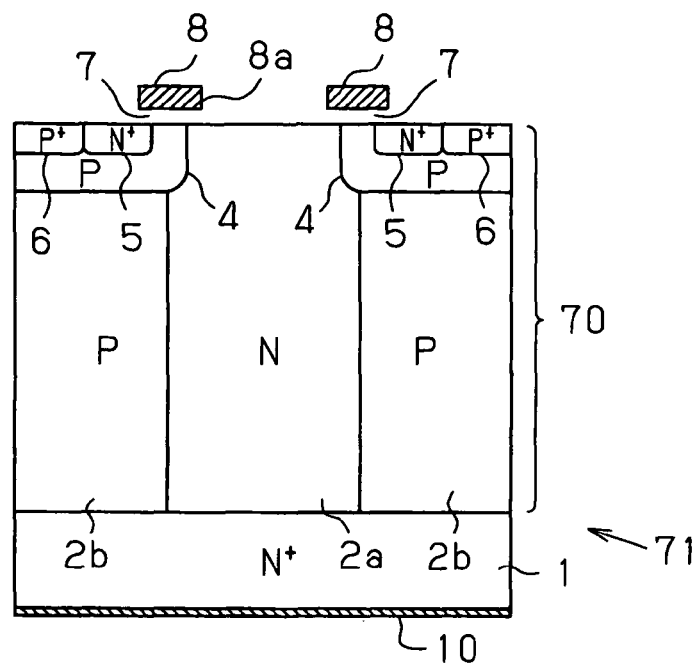
FIGS. 23A and 23B are cross sectional views explaining the method for manufacturing the device in FIG. 21.
Figure 23B:
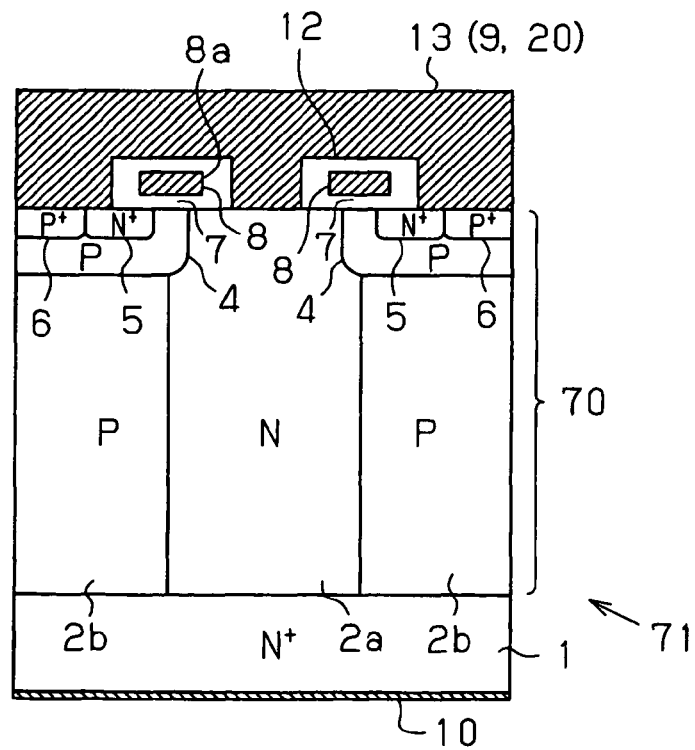

Further, as shown in FIG. 22C, a P type channel forming area 4 and an N type source area 5 are formed in the silicon layer 70 in self alignment with respect to the planar gate electrode 8, and a P type source contact area 6 is formed. Further, as shown in FIG. 23A, an opening portion 8a is formed by removing the forming area of an anode electrode 20 constituting the Schottky barrier diode (SBD) in the planar gate electrode 8, i.e., one portion of the planar gate electrode 8 by photo lithography etching method. Further, as shown in FIG. 23B, a silicon oxide film 12 as an insulating film is formed on the entire face, and the forming area of a source electrode 9 in the silicon oxide film 12 and the forming area of the anode electrode 20 are removed by the photo lithography etching method. An electrode 13 is formed after the upper face of the silicon layer 70 in the forming area of the source electrode 9 and the forming area of the anode electrode 20 is exposed. The electrode 13 becomes the source electrode 9 and the anode electrode 20 in FIG. 21. Thus, the semiconductor device of FIG. 21 is obtained.

In this embodiment mode, as explained by using FIG. 13, a contact area 21 of the N type having concentration further lower than that of the impurity diffusive area 2a of the N type as the drift area may be also formed in a portion coming in contact with the anode electrode 20 in a part exposing the impurity diffusive area 2a of the N type as the drift area on the upper face of the silicon layer 70. In this embodiment mode, as explained by using FIG. 14, a guard ring area 22 of the P type may be also formed so as to surround the portion coming in contact with the anode electrode 20 in the part exposing the impurity diffusive area 2a of the N type as the drift area on the upper face of the silicon layer 70.

Figure 24:
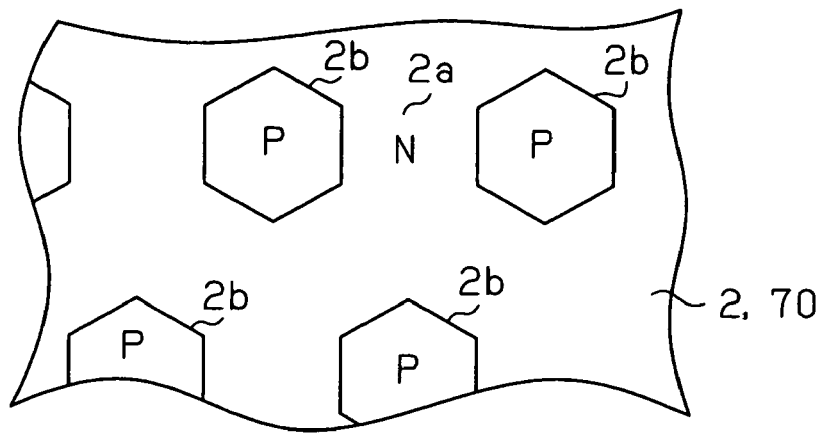
FIG. 24 is a plan view showing another super junction construction in a semiconductor device.
Figure 25:
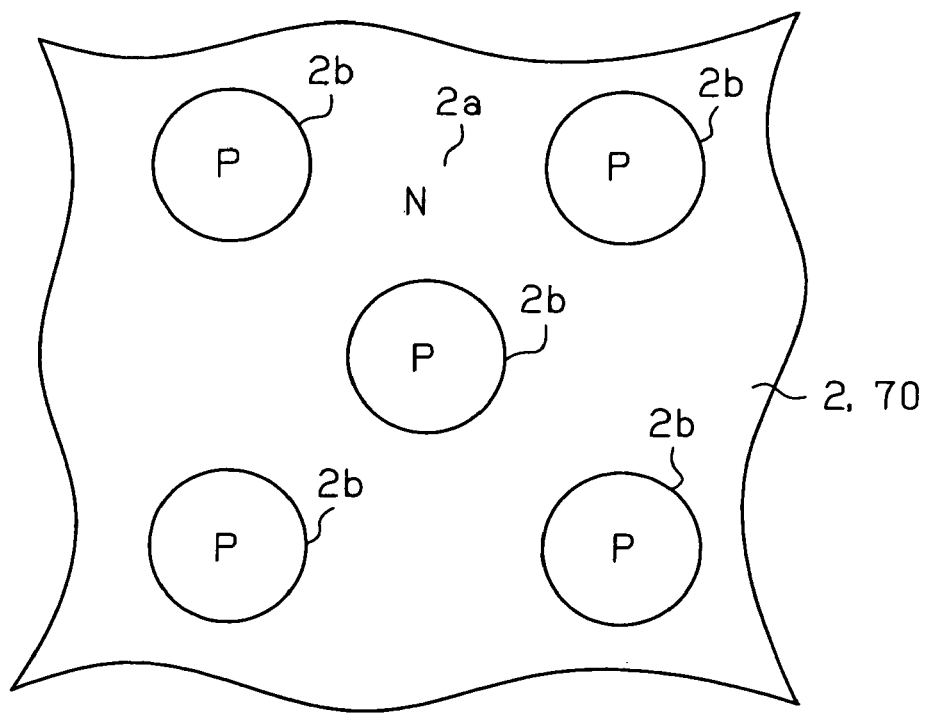
FIG. 25 is a plan view showing further another super junction construction in a semiconductor device.
Figure 26:
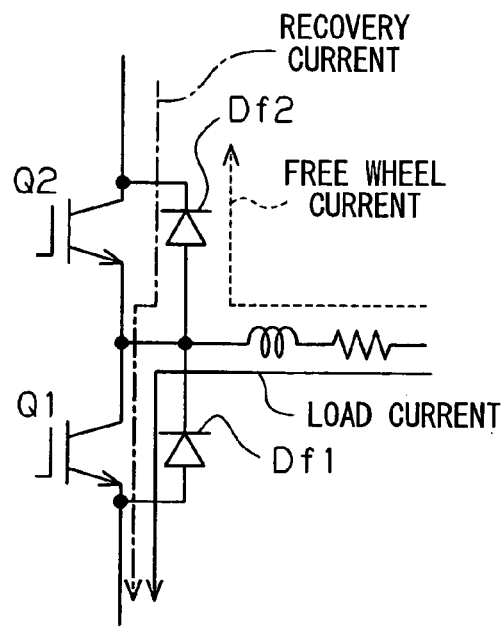
FIG. 26 is a circuit diagram showing an equivalent circuit of one phase inverter in an inverter circuit a semiconductor device according to a prior art.
Figure 27:
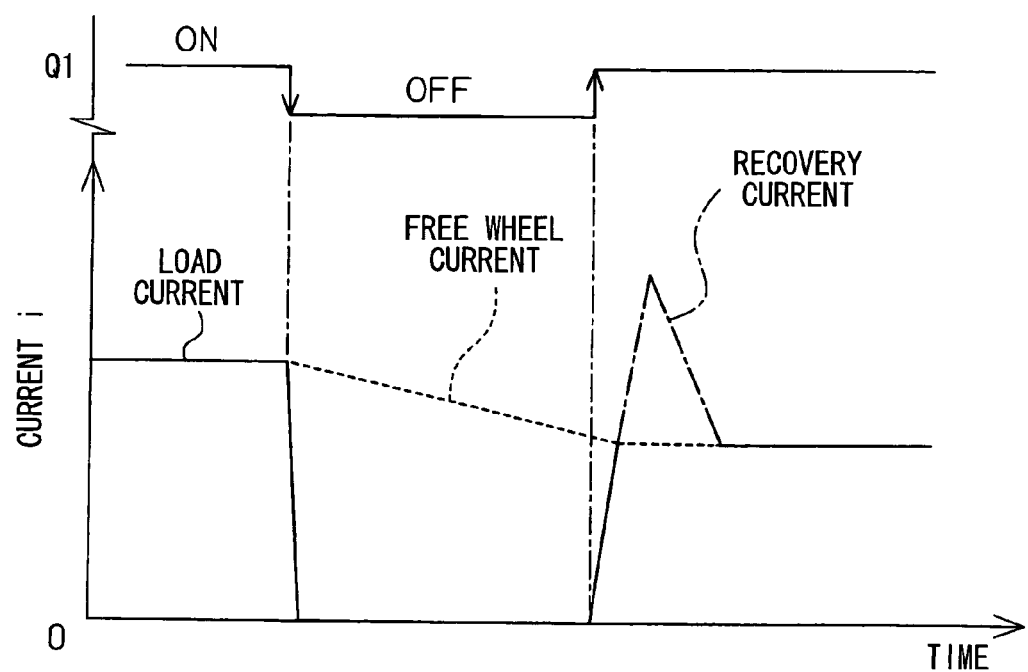
FIG. 27 is a timing chart showing the inverter in FIG. 26.

In each of the above embodiment modes, the stripe shape is set as a planar shape with respect to the PN junction using the N type impurity diffusive area 2a and the P type impurity diffusive area 2b in the silicon layers 2, 70. However, a hexagonal shape may be also formed as shown in FIG. 24, and a circular shape may be also formed as shown in FIG. 25. Concretely, in FIG. 24, the hexagonal shape is formed as the planar shape of the P type impurity diffusive area 2b, and is arranged in a dot shape. In FIG. 25, the circular shape is formed as the planar shape of the P type impurity diffusive area 2b, and is arranged in a dot shape.

Further, the N channel transistor has been explained so far, but the invention may be also applied to a P channel transistor. In this case, the first electric conductivity type becomes the P type, and the second electric conductivity type becomes the N type.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device having a super junction MOS transistor, comprising:

a semiconductor substrate having a first conductive type and a high impurity concentration;

a first semiconductor layer disposed on the substrate, wherein the first semiconductor layer includes a plurality of first impurity diffusion regions having the first conductive type and a plurality of second impurity diffusion regions having a second conductive type, which are alternately arranged so that the first semiconductor layer provides a drift region;

a second semiconductor layer having the first conductive type disposed on the first semiconductor layer, wherein the second semiconductor layer has a low impurity concentration, which is lower than that of the first semiconductor layer;

a channel forming region having the second conductive type disposed in a first portion of the second semiconductor layer;

a source region having the first conductive type disposed in a first portion of the channel forming region;

a source contact region having the second conductive type disposed in a second portion of the channel forming region;

a gate electrode disposed on a third portion of the channel forming region through a gate insulation film, the third portion being exposed from the source region and the source contact region;

a source electrode disposed on the source region and the source contact region;

a drain electrode disposed on a backside of the substrate, which is opposite to the first semiconductor layer; and an anode electrode disposed on a second portion of the second semiconductor layer, the second portion of the second semiconductor layer having a surface exposed from the channel forming region, wherein the anode electrode and a two-layered structure of the first semiconductor layer and the second semiconductor layer provide a Schottky barrier diode so that the super junction MOS transistor and the Schottky barrier diode are integrated in the semiconductor device, the second semiconductor layer is thinner than the first semiconductor layer, each of the plurality of second impurity diffusion regions directly contacts the channel forming region of the second conductivity type without directly contacting the second semiconductor layer of the first conductivity type, each of the plurality of first impurity diffusion regions directly contacts the second semiconductor layer of the first conductivity type without directly contacting the channel forming region of the second conductivity type, none of the plurality of second impurity diffusion regions directly contacts the second semiconductor layer of the first conductivity type, and a forward bias voltage of the Schottky barrier diode is lower than a forward bias voltage of a first built-in PN diode provided by the channel forming region and the second semiconductor layer, and the forward bias voltage of the Schottky barrier diode is lower than a forward bias voltage of a second built-in PN diode provided by one of the plurality of first impurity diffusion regions and an adjacent one of the plurality of second impurity diffusion regions.

2. The semiconductor device according to claim 1, wherein the channel forming region includes a plurality of channel forming portions, the source region includes a plurality of source portions, which correspond to the channel forming portions, respectively, the source contact region includes a plurality of source contact portions, which correspond to the channel forming portions, respectively, the gate electrode includes a plurality of gate electrode portions, which correspond to the channel forming portions, respectively, the source electrode includes a plurality of source electrode portions, which correspond to the channel forming portions, respectively, the anode electrode includes a plurality of anode electrode portions, which correspond to the surface of the second portion of the second semiconductor layer between the channel forming portions, respectively, and the surface of the second portion of the second semiconductor layer exposed from the channel forming region is sandwiched between adjacent two channel forming portions.

3. The semiconductor device according to claim 2, wherein each anode electrode portion is disposed on an opening between two adjacent gate electrode portions, and the surface of the second portion of the second semiconductor layer is exposed from the channel forming region through the opening.

4. The semiconductor device according to claim 1, wherein the low impurity concentration of the second semiconductor layer is determined in such a manner that a forward bias voltage of the Schottky barrier diode is lower than that of the first or second built-in PN diode.

5. The semiconductor device according to claim 1, wherein the anode electrode and the source are electrically connected.

6. The semiconductor device according to claim 1, further comprising:

a contact region disposed under the anode electrode and in the second portion of the second semiconductor layer, wherein the contact region has the first conductive type, and the contact region has an impurity concentration, which is lower than that of the second portion of the second semiconductor layer.

7. The semiconductor device according to claim 1, further comprising:

a guard ring having the second conductive type, wherein the guard ring surrounds the surface of the second portion of the second semiconductor layer, on which the anode electrode is disposed.

8. The semiconductor device according to claim 7, wherein the guard ring has a depth deeper than that of the source region so that an electric field under the Schottky barrier diode is relaxed.

9. The semiconductor device according to claim 7, wherein the guard ring has a same depth and a same impurity concentration as the channel forming region.

10. The semiconductor device according to claim 1, wherein each first impurity diffusion region or each second impurity diffusion region has a planar shape, which is a hexagon or a circle.

11. The semiconductor device according to claim 1, further comprising:

a guard ring having the second conductive type, wherein the guard ring surrounds the surface of the second portion of the second semiconductor layer, on which the anode electrode is disposed.

12. The semiconductor device according to claim 11, wherein the guard ring has a depth deeper than that of the source region so that an electric field under the Schottky barrier diode is relaxed.

13. The semiconductor device according to claim 11, wherein the guard ring has a same depth and a same impurity concentration as the channel forming region.

14. The semiconductor device according to claim 1, wherein:

the source region has an impurity concentration which is higher than that of the first semiconductor layer; and the source contact region has an impurity concentration which is higher than that of the channel forming region.

15. The semiconductor device according to claim 1, wherein the second semiconductor layer exists under the anode electrode.

16. The semiconductor device according to claim 15, wherein the second semiconductor layer does not exist under the channel forming region, and the anode electrode faces at least one of the plurality of first impurity diffusion regions via the second semiconductor layer.

17. The semiconductor device according to claim 1, wherein the anode electrode is vertically aligned with one of the plurality of first impurity diffusion regions and the second semiconductor layer within a transistor cell forming area.

* * * * *